(12) United States Patent
Tanaka et al.

(10) Patent No.: US 12,563,791 B2
(45) Date of Patent: Feb. 24, 2026

(54) NITRIDE SEMICONDUCTOR DEVICE AND METHOD FOR MANUFACTURING NITRIDE SEMICONDUCTOR DEVICE

(71) Applicant: FUJI ELECTRIC CO., LTD., Kawasaki (JP)

(72) Inventors: Ryo Tanaka, Hino (JP); Shinya Takashima, Hachioji (JP); Katsunori Ueno, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 333 days.

(21) Appl. No.: 18/172,627

(22) Filed: Feb. 22, 2023

(65) Prior Publication Data

US 2023/0326959 A1    Oct. 12, 2023

(30) Foreign Application Priority Data

Apr. 8, 2022    (JP) ................................. 2022-064579

(51) Int. Cl.
| | |
|---|---|
| *H01L 29/06* | (2006.01) |
| *H01L 21/265* | (2006.01) |
| *H10D 30/63* | (2025.01) |
| *H10D 62/10* | (2025.01) |
| *H10D 62/17* | (2025.01) |
| *H10D 62/85* | (2025.01) |
| *H10D 62/854* | (2025.01) |

(52) U.S. Cl.
CPC ....... *H10D 62/105* (2025.01); *H01L 21/2654* (2013.01); *H10D 30/63* (2025.01); *H10D 62/393* (2025.01); *H10D 62/8503* (2025.01); *H10D 62/854* (2025.01)

(58) Field of Classification Search
None
See application file for complete search history.

(56) References Cited

U.S. PATENT DOCUMENTS

| | | |
|---|---|---|
| 10,170,564 B2 | 1/2019 | Ueno et al. |
| 10,749,003 B2 | 8/2020 | Ueno et al. |

(Continued)

FOREIGN PATENT DOCUMENTS

| | | |
|---|---|---|
| JP | 2018010892 A | 1/2018 |
| JP | 2020-47655 A | 3/2020 |

(Continued)

OTHER PUBLICATIONS

Akira Uedono et al.; "Dopant activation process in Mg-implanted GaN studied by monoenergetic positron beam"; scientific reports; 11 (2021) 20660; www.nature.com/scientificreports; (8 pages) (in English).

(Continued)

*Primary Examiner* — William C Trapanese

(57)    ABSTRACT

An impurity region of P-type that the field effect transistor of the nitride semiconductor device includes has a peak position at which concentration of P-type impurities reaches a maximum at a position located away from an interface with a gate insulating film. The impurity region has an inflection point at which concentration of the P-type impurities changes from increase to decrease toward the interface or a rate of decrease in the concentration of the P-type impurities increases toward the interface at a position located between the interface and the peak position.

15 Claims, 22 Drawing Sheets

(56)                    References Cited

U.S. PATENT DOCUMENTS

| | | | |
|---|---|---|---|
| 11,362,174 B2 | 6/2022 | Shimizu | |
| 2018/0012964 A1 | 1/2018 | Ueno et al. | |
| 2019/0131409 A1 | 5/2019 | Ueno et al. | |
| 2021/0118984 A1 | 4/2021 | Shimizu et al. | |
| 2021/0216092 A1* | 7/2021 | Chang | G05F 1/562 |
| 2022/0059681 A1* | 2/2022 | Suzuki | H10D 62/127 |

FOREIGN PATENT DOCUMENTS

| | | | |
|---|---|---|---|
| JP | 2021009989 A | 1/2021 |
| JP | 2021068722 A | 4/2021 |

OTHER PUBLICATIONS

K. Shima et al.; "Improved minority carrier lifetime in p-type GaN segments prepared by vacancy-guided redistribution of Mg"; Nov. 3, 2021; Appl. Phys. Lett. 119, 182106 (2021); http://doi.org/10/1063/5.0066347; (8 pages) (in English).

Yusuke Kobayashi et al.; "SiC-MOSFET with High Threshold Voltage and Low On-Resistance Using Halo Structure"; Fuji Electric Journal 2018, vol. 91, No. 4, 30-33; (4 pages) (English Abstract only, concise statement).

Office Action dated Jan. 6, 2026, issued in Japanese Application No. JP2022-064579.

* cited by examiner

NITRIDE SEMICONDUCTOR DEVICE AND METHOD FOR MANUFACTURING NITRIDE SEMICONDUCTOR DEVICE

CROSS REFERENCE TO RELATED APPLICATIONS AND INCORPORATION BY REFERENCE

This application claims benefit of priority under 35 USC 119 based on Japanese Patent Application No. 2022-064579 filed on Apr. 8, 2022, the entire contents of which are incorporated by reference herein.

TECHNICAL FIELD

The present disclosure relates to a nitride semiconductor device and a method for manufacturing nitride semiconductor device.

BACKGROUND ART

A technology in which, when vertical MOSFETs using gallium nitride (GaN) are manufactured, impurity regions of P-type are formed by ion-implanting Mg into a GaN layer and subjecting the GaN layer to heat treatment has been known (see, for example, JP 2021-009989 A).

SUMMARY OF INVENTION

Technical Problem

In order to increase the breakdown voltage of a vertical MOSFET of N-type using GaN, a highly concentrated P-type (hereinafter, also referred to as $P^+$-type) region is required to be formed at a position deep from the front surface of the GaN layer. When a $P^+$-type region is formed by an ion implantation method, heat treatment to activate P-type impurities is required to be performed after ion implantation. By the heat treatment, some of the P-type impurities diffuse from the deep position in the GaN layer to the front surface side. When the concentration of the P-type impurities unintentionally increases at the front surface of the GaN layer and in the vicinity thereof, there is a possibility that characteristics of the vertical MOSFET deteriorate, such as the threshold voltage of the vertical MOSFET becoming higher than necessary.

The present disclosure has been made in consideration of the above-described situation, and an object of the present disclosure is to provide a nitride semiconductor device capable of preventing characteristics of a field effect transistor from deteriorating and a method for manufacturing the nitride semiconductor device.

Solution to Problem

In order to achieve the above-described object, according to an aspect of the present disclosure, there is provided a nitride semiconductor device including: a gallium nitride layer having a first principal surface and a second principal surface located on an opposite side to the first principal surface; and a field effect transistor formed in the gallium nitride layer, wherein the field effect transistor includes: a gate insulating film formed on the first principal surface side of the gallium nitride layer; and an impurity region of P-type formed in the gallium nitride layer and in contact with the gate insulating film, the impurity region has a peak position at which concentration of P-type impurities reaches a maximum at a position located away from an interface between the impurity region and the gate insulating film, in a vertical direction perpendicularly intersecting the interface, distance from the interface to the peak position is 200 nm or more and 1500 nm or less, concentration of the P-type impurities at the peak position is $5\times10^{18}$ cm$^{-3}$ cm$^{-3}$ or more, concentration of the P-type impurities at the interface of the impurity region is $1\times10^{16}$ cm$^{-3}$ or more and $3\times10^{18}$ cm$^{-3}$ or less, the impurity region has an inflection point at which concentration of the P-type impurities changes from increase to decrease toward the interface or a rate of decrease in the concentration of the P-type impurities increases toward the interface at a position located between the interface and the peak position and located away respectively from the interface and from the peak position, and concentration of the P-type impurities at the inflection point is $3\times10^{18}$ cm$^{-3}$ or more and a concentration value of the P-type impurities at the peak position or less.

According to another aspect of the present disclosure, there is provided a method for manufacturing a nitride semiconductor device including: a step of ion-implanting P-type impurities into a preset region in a gallium nitride layer from a first principal surface side of the gallium nitride layer; a step of ion-implanting an inert element into the region from the first principal surface side; a step of, by subjecting the gallium nitride layer into which the P-type impurities and the inert element are ion-implanted to heat treatment and activating the P-type impurities, forming an impurity region of P-type in the gallium nitride layer; and a step of forming a gate insulating film on the first principal surface side of the gallium nitride layer in which the impurity region is formed, wherein, in the step of ion-implanting the P-type impurities, the method ion-implants the P-type impurities in such a way that in a vertical direction perpendicularly intersecting an interface between the impurity region and the gate insulating film, a position located 200 nm or more and 1500 nm or less away from the interface becomes a peak position of an amount of implanted ions of the P-type impurities, and concentration of the P-type impurities at a peak position of an amount of implanted ions of the P-type impurities is $5\times10^{18}$ cm$^{-3}$ or more after the heat treatment.

Advantageous Effects of Invention

According to the present disclosure, it is possible to provide a nitride semiconductor device capable of preventing characteristics of a field effect transistor from deteriorating and a method for manufacturing the nitride semiconductor device.

BRIEF DESCRIPTION OF DRAWINGS

FIG. 3 is another cross-sectional view illustrative of the configuration example of the GaN semiconductor device according to the first embodiment of the present disclosure;

FIG. 5B is another cross-sectional view illustrative of the method for manufacturing the vertical MOSFET according to the first embodiment of the present disclosure in the sequence of steps;

FIG. 5C is still another cross-sectional view illustrative of the method for manufacturing the vertical MOSFET according to the first embodiment of the present disclosure in the sequence of steps;

FIG. 5D is still another cross-sectional view illustrative of the method for manufacturing the vertical MOSFET according to the first embodiment of the present disclosure in the sequence of steps;

FIG. 5E is still another cross-sectional view illustrative of the method for manufacturing the vertical MOSFET according to the first embodiment of the present disclosure in the sequence of steps;

FIG. 6 is a graph illustrative of distributions of Mg concentration in the depth direction of a GaN substrate according to an example of the present disclosure;

FIG. 12A is a cross-sectional view illustrative of a method for manufacturing a vertical MOSFET according to the second embodiment of the present disclosure in the sequence of steps;

FIG. 12B is another cross-sectional view illustrative of the method for manufacturing the vertical MOSFET according to the second embodiment of the present disclosure in the sequence of steps;

FIG. 12C is still another cross-sectional view illustrative of the method for manufacturing the vertical MOSFET according to the second embodiment of the present disclosure in the sequence of steps;

FIG. 12D is still another cross-sectional view illustrative of the method for manufacturing the vertical MOSFET according to the second embodiment of the present disclosure in the sequence of steps;

FIG. 12E is still another cross-sectional view illustrative of the method for manufacturing the vertical MOSFET according to the second embodiment of the present disclosure in the sequence of steps;

DESCRIPTION OF EMBODIMENTS

Figure 1:
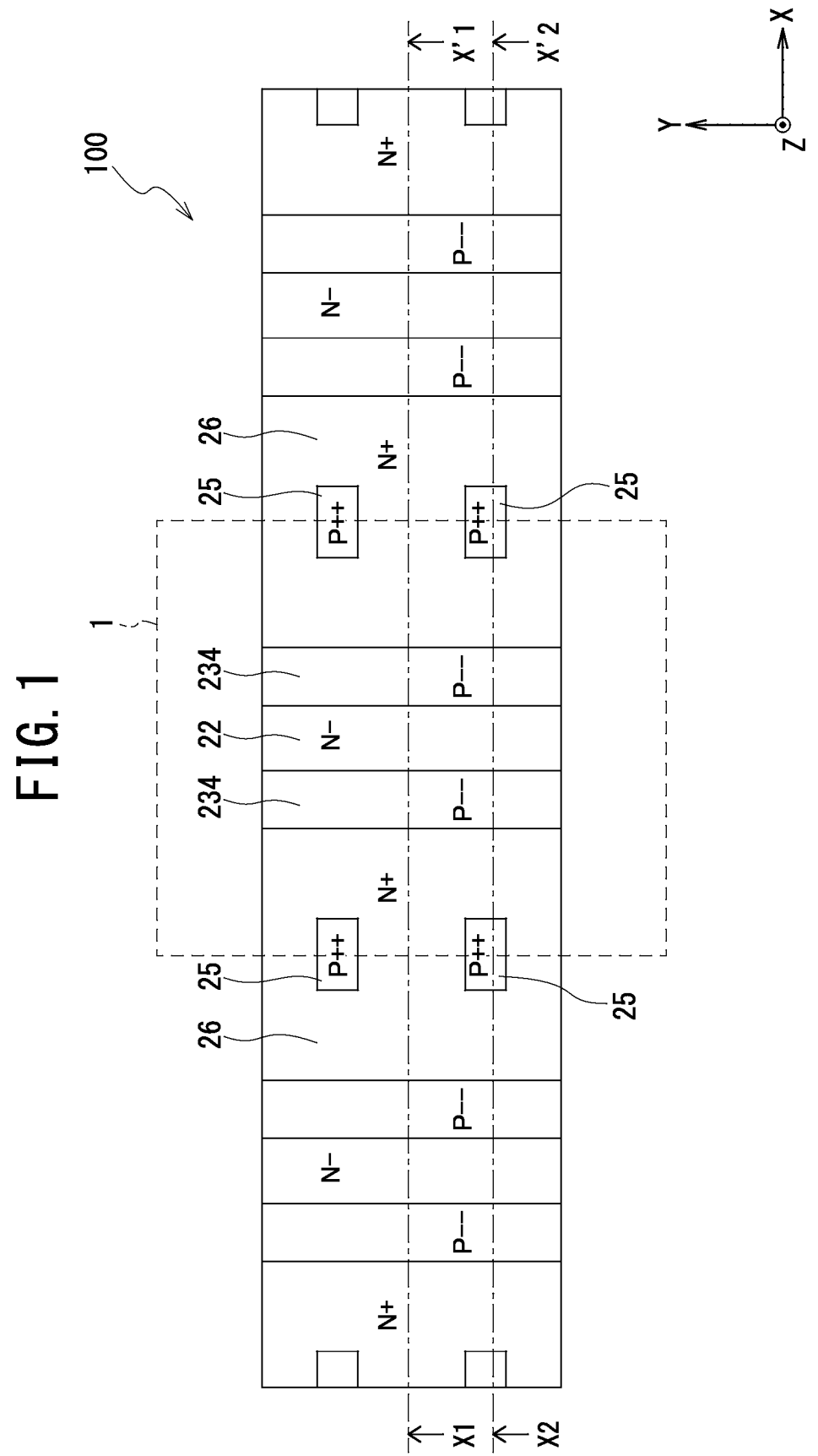
FIG. 1 is a plan view illustrative of a configuration example of a GaN semiconductor device according to a first embodiment of the present disclosure.

Embodiments of the present invention will be described below. In the following description of the drawings, the same or similar portions are denoted by the same or similar reference numerals. However, it should be noted that the drawings are schematic and a relation between a thickness and a flat dimension, a ratio of thicknesses of respective devices or members, and the like are different from actual ones. Accordingly, specific thicknesses and dimensions should be determined with reference to the following description. In addition, it is certain that some portions have different dimensional relations and ratios between the drawings.

In the following description, descriptions relating to directions are sometimes made using wording such as "X-axis direction", "Y-axis direction", and "Z-axis direction". For example, the X-axis direction and the Y-axis direction are directions parallel to a front surface 10a of a GaN substrate 10. The X-axis direction and the Y-axis direction are also referred to as horizontal directions. The Z-axis direction is a normal direction of the front surface 10a. The X-axis direction, the Y-axis direction, and the Z-axis direction intersect one another at right angles.

In the following description, the arrow direction and the opposite direction to the arrow direction of the Z-axis are sometimes referred to as "upper" and "lower", respectively. The "upper" and the "lower" do not necessarily mean the vertical directions with respect to the ground surface. In other words, the "upper" direction and the "lower" direction are not limited to the directions of gravitational force. The "upper" and the "lower" are nothing more than expressions for the sake of convenience to specify relative positional relations in a region, a layer, a film, a substrate, or the like, and do not limit a technological concept of the present disclosure. For example, it is needless to say that, when the plane of paper is rotated 180 degrees, "upper" and "lower" are exchanged with "lower" and "upper", respectively.

In the following description, signs + and − attached to P or N, which indicate conductivity types of a semiconductor region, indicate that semiconductor regions to the conductivity types of which the signs + and − are attached are semiconductor regions the impurity concentrations of which are relatively higher and lower than another semiconductor region to the conductivity type of which neither + nor − is attached, respectively. However, two semiconductor regions having the same conductivity type P assigned thereto does not necessarily mean that the impurity concentrations of the semiconductor regions are exactly the same.

First Embodiment

Configuration Example

Figure 2:
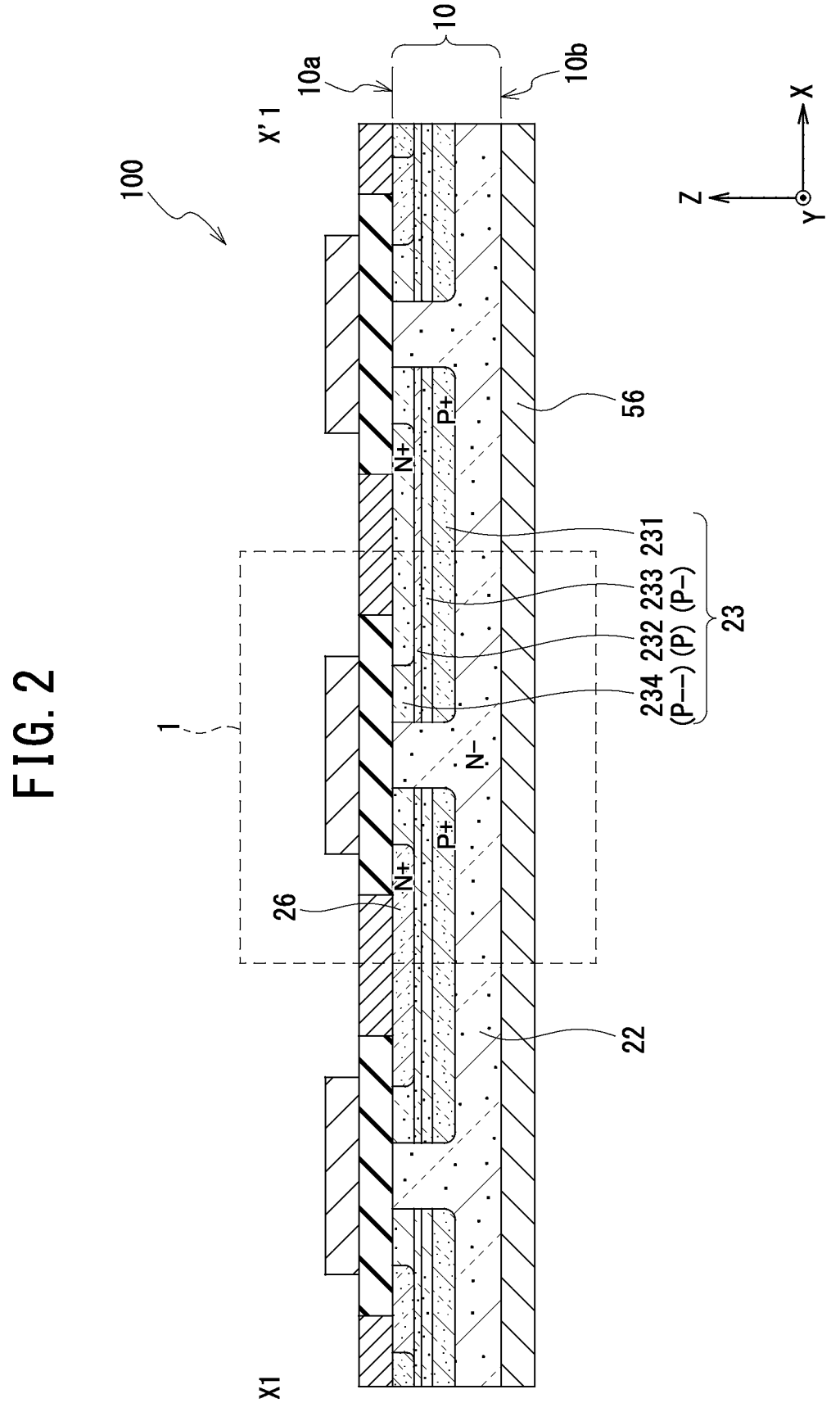
FIG. 2 is a cross-sectional view illustrative of the configuration example of the GaN semiconductor device according to the first embodiment of the present disclosure.
Figure 3:
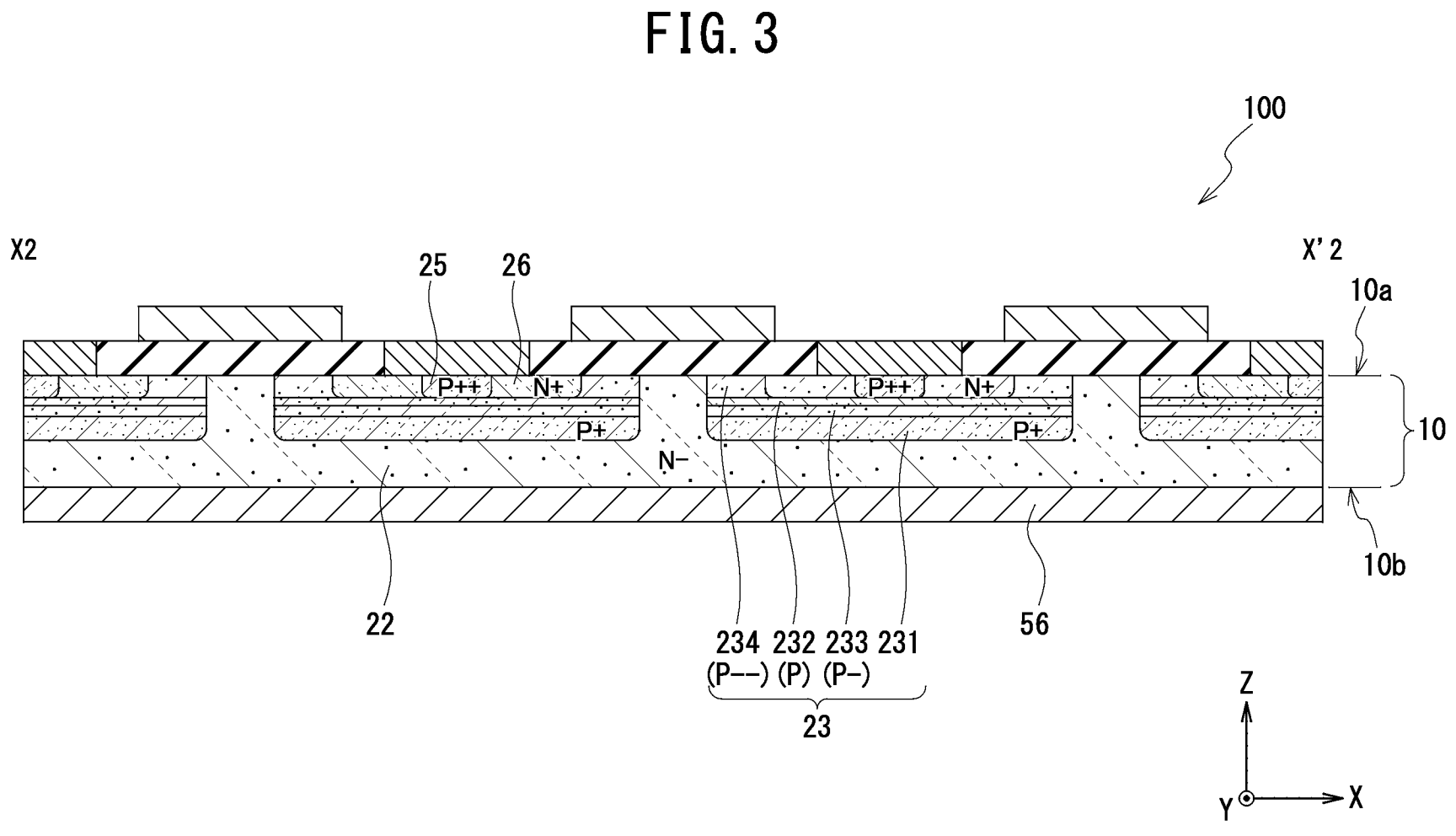
Figure 4:
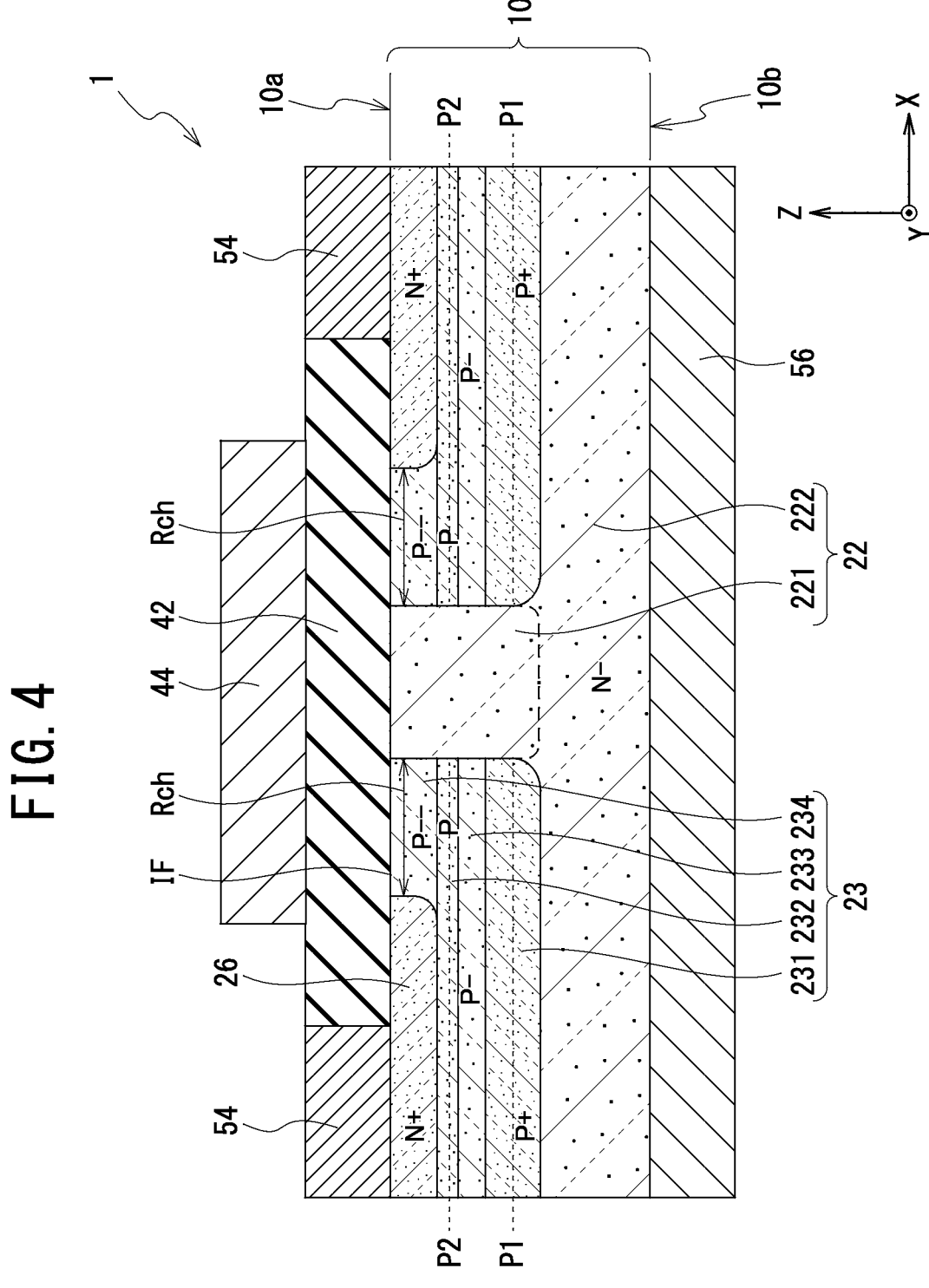
FIG. 4 is a cross-sectional view illustrative of a vertical MOSFET illustrated in FIG. 2 in an enlarged manner.

FIG. 1 is a plan view illustrative of a configuration example of a gallium nitride (GaN) semiconductor device 100 (an example of a "nitride semiconductor device" of the present disclosure) according to a first embodiment of the present disclosure. FIGS. 2 and 3 are cross-sectional views illustrative of the configuration example of the GaN semiconductor device 100 according to the first embodiment of the present disclosure. FIG. 2 illustrates a cross-section of the plan view in FIG. 1 taken along the line X1-X'1 of FIG. 1, which is parallel with the X-axis. FIG. 3 illustrates a cross-section of the plan view in FIG. 1 taken along the line X2-X'2 of FIG. 1, which is parallel with the X-axis. FIG. 4 is a cross-sectional view illustrative of a vertical MOSFET 1 illustrated in FIG. 2 in an enlarged manner. Note that, in FIG. 1, illustrations of gate electrodes 44 and source electrodes 54 illustrated in FIGS. 2 to 4 are omitted.

The GaN semiconductor device 100 illustrated in FIGS. 1 to 4 is a power device. As illustrated in FIGS. 1 to 3, a plurality of vertical metal oxide semiconductor field effect transistors (MOSFETs) 1 are formed in the GaN semiconductor device 100. A vertical MOSFET 1 is an example of a "field effect transistor" of the present disclosure. For example, the plurality of vertical MOSFETs 1 are repeatedly formed in one direction (for example, the X-axis direction). One vertical MOSFET 1 is a unit structure of the repeat, and the unit structures are arranged in line in one direction (for example, the X-axis direction).

As illustrated in FIGS. 2 to 4, the vertical MOSFET 1 is a MOSFET of a planar gate type and includes a gallium nitride substrate (an example of a "gallium nitride layer" of the present disclosure, and, hereinafter, referred to as a GaN substrate) 10, a gate insulating film 42, a gate electrode 44 that is formed on the gate insulating film 42, source electrodes 54, and a drain electrode 56.

The GaN substrate 10 (an example of the "gallium nitride layer" of the present disclosure) is a GaN single crystal substrate. The GaN substrate 10 is, for example, a substrate of N⁻-type. The GaN substrate 10 has a front surface 10a (an example of a "first principal surface" of the present disclosure) and a back surface 10b (an example of a "second principal surface" of the present disclosure) that is located on the opposite side to the front surface 10a. For example, the GaN substrate 10 is a low dislocation free-standing GaN substrate the threading dislocation density of which is less than $1\times10^7$ cm⁻².

N-type impurities (donor element) contained in the GaN substrate 10 include at least one of silicon (Si) and oxygen (O). In addition, P-type impurities (acceptor element) contained in the GaN substrate 10 include at least one of magnesium (Mg) and beryllium (Be).

Even when a power device having a large area is formed in the GaN substrate 10, the GaN substrate 10 being a low dislocation free-standing GaN substrate enables leakage current in the power device to be reduced. This capability enables power devices to be manufactured with a high non-defective rate. It is also possible to prevent impurities that are ion-implanted from deeply diffusing along dislocations in heat treatment that is included in a manufacturing process of the vertical MOSFETs 1.

Note that the GaN substrate 10 may include a GaN single crystal substrate and a single crystal GaN layer that is epitaxially grown on the GaN single crystal substrate. In this case, the GaN single crystal substrate may be of an N⁺-type or an N-type, and the GaN layer may be of the N-type or an N⁻-type.

Although, in the vertical MOSFET 1, semiconductor material is GaN, the semiconductor material may include one or more elements from among aluminum (Al) and indium (In). The semiconductor material may be a mixed crystal semiconductor that contains a small amount of Al and In, that is, $Al_xIn_yGa_{1-x-y}N$ ($0\leq x<1$, $0\leq y<1$). Note that GaN is a semiconductor when x and y in $Al_xIn_yGa_{1-x-y}N$ are set as x=y=0.

In the GaN substrate 10, a drift region 22, impurity regions 23 of P-type, contact regions 25 of P⁺⁺-type, and source regions 26 of N⁺-type are formed. The impurity regions 23, the contact regions 25, and the source regions 26 are respectively regions where impurities are ion-implanted to predetermined depths from the front surface 10a of the GaN substrate 10 and the impurities are activated by heat treatment. For example, the impurity regions 23 and the contact regions 25 include Mg as P-type impurities. The drift region 22 and the source regions 26 contain, for example, Si as N-type impurities.

Each of the impurity regions 23 of P-type is, for example, a well region of P-type and includes a P⁺-type region 231 where Mg concentration (an example of "concentration of P-type impurities" of the present disclosure) is high, a P⁻-type region 233 where the Mg concentration is lower than the P⁺-type region 231, a P-type region 232 where the Mg concentration is lower than the P⁺-type region 231 and higher than the P⁻-type region 233, and P⁻⁻-type regions 234 where the Mg concentration is lower than the P⁻-type region 233.

The P⁺-type region 231 includes a peak position P1 at which the Mg concentration reaches a maximum. The P-type region 232 includes a local peak position P2 at which the Mg concentration reaches a local maximum. From an interface IF between the impurity region 23 and a gate insulating film 42 toward the peak position P1, the P⁻⁻-type regions 234, the P-type region 232, the P⁻-type region 233, and P⁺-type region 231 are arranged in this order. Since the vertical MOSFET 1 is of the planar gate type, the above-described interface IF is parallel with the front surface 10a of the GaN substrate 10.

In addition, the contact regions 25 are regions of P⁺⁺-type. The contact regions 25 have a higher concentration of the P-type impurities than the impurity regions 23. For example, the Mg concentration in the impurity regions 23 is $1\times10^{16}$ cm⁻³ or more. The Mg concentration in the contact regions 25 is $5\times10^{18}$ cm⁻³ or more and $2\times10^{20}$ cm⁻³ or less.

The drift region 22 is a region of N⁻-type, and the source regions 26 are regions of N⁺-type. The source regions 26 have a higher concentration of the N-type impurities than the drift region 22. For example, the concentration of the N-type impurities in the drift region 22 is the same as the concentration of the N-type impurities in the GaN substrate 10. In this case, the N-type impurities do not have to be ion-implanted into the drift region 22. Each of the source regions 26 is formed on the front surface side of one of the impurity regions 23. The source region 26 is formed by Si being ion-implanted into the front surface side of the impurity region 23 and Si being activated by heat treatment.

As illustrated in FIGS. 2 to 4, upper portions of the source regions 26 are exposed on the front surface 10a of the GaN substrate 10. A bottom portion and first side portions of each of the source regions 26 are in contact with an impurity region 23. In addition, as illustrated in FIGS. 1 and 3, second side portions of the source region 26 are in contact with the impurity region 23 and a contact region 25. Each of the first side portions of the source region 26 is located on the side on which a region (hereinafter, referred to as a channel region) Rch in which a channel of the vertical MOSFET 1 is to be formed is located. Each of the second side portions of the source region 26 is located on the opposite side to the side on which one of the first side portions is located in the X-axis direction.

For example, the first side portions of each of the source regions 26 are in contact with the P⁻⁻-type regions 234 of an impurity region 23 in a direction parallel with the interface IF. In a P⁻⁻-type region 234 adjacent to a first side portion of the source region 26, a channel of the vertical MOSFET 1 is formed. In addition, the bottom portion of the source region 26 and a bottom portion of the contact region 25 are in contact with the P-type region 232 of an impurity region 23.

In addition, the P⁺-type regions 231 are in contact with the drift region 22. Because of this configuration, it is possible to mitigate charge concentration on the gate insulating films 42 and the P$^{--}$-type regions 234, and breakdown voltage of the vertical MOSFETs 1 is increased.

The impurity regions 23 and the source regions 26 have stripe shapes extending in the Y-axis direction when viewed in plan. The contact regions 25 are, for example, arranged at constant intervals respectively in the X-axis direction and the Y-axis direction.

As illustrated in FIG. 4, upper portions (hereinafter, referred to as upper regions) 221 of the drift region 22 are exposed on the front surface 10*a* of the GaN substrate 10. Each of the upper regions 221 is in contact with one of the gate insulating films 42 at the front surface 10*a*. Each of the upper regions 221 is located between a pair of impurity regions 23 that face each other in the X-axis direction. The upper regions 221 may be referred to as JFET regions.

A lower portion (hereinafter, referred to as a lower region) 222 of the drift region 22 is in contact with the bottom portions of the impurity regions 23. The lower region 222 is located respectively between the upper regions 221 and the drain electrode 56 and between the impurity regions 23 and the drain electrode 56. The lower region 222 may be formed in a continuous manner in the Y-axis direction across a plurality of vertical MOSFETs 1 (that is, a plurality of unit structures) that are repeated in the Y-axis direction.

The drift region 22 functions as current paths between the drain electrode 56 and the channel regions Rch. Note that the upper regions (JFET regions) 221 of the drift region 22 may have a higher N-type concentration than the lower region 222 by, for example, ion-implanting the N-type impurities. For example, the JFET regions 221 may be of the N-type. This configuration enables on-resistance of the vertical MOSFETs 1 to be reduced.

Each of the contact regions 25 is in contact with one of the impurity regions 23 and has a function of fixing the potential of the impurity region 23 at the potential of a source electrode 54 in contact with the contact region 25 (for example, a ground potential). The contact regions 25 also function as hole extraction paths at the time of turning off the gates.

The gate insulating films 42 are, for example, silicon oxide films (SiO$_2$ films). The gate insulating films 42 are, for example, formed on the flat front surface 10*a*.

Each of the gate electrodes 44 is formed over channel regions Rch with a gate insulating film 42 interposed therebetween. In the vertical MOSFETs 1, the gate electrodes 44 are gate electrodes of a planar type that are respectively formed on the flat gate insulating films 42. The gate electrodes 44 are formed of polysilicon into which impurities are doped.

The source electrodes 54 are formed on the front surface 10*a* of the GaN substrate 10. Each of the source electrodes 54 is in contact with a portion of a source region 26 and a contact region 25. The source electrodes 54 may also be formed over the gate electrodes 44 with not-illustrated interlayer insulating films interposed therebetween. The interlayer insulating films may cover upper portions and side portions of the gate electrodes 44 lest the gate electrodes 44 and the source electrodes 54 electrically connect to each other.

The source electrodes 54 are made of, for example, Al or alloy of Al—Si. The source electrodes 54 may have barrier metal layers between the front surface 10*a* of the GaN substrate 10 and Al (or Al—Si). Titanium (Ti) may be used as a material of the barrier metal layers. The drain electrode 56 is formed on the back surface 10*b* side of the GaN substrate 10 and is in contact with the back surface 10*b*. The drain electrode 56 is made of the same material as that of the source electrodes 54.

In a vertical MOSFET 1, when a potential greater than or equal to a threshold voltage is applied to the gate electrode 44, inversion layers are formed in the channel regions Rch. When a predetermined high potential is applied to the drain electrode 56 and a low potential (for example, the ground potential) is applied to the source electrodes 54 while inversion layers are formed in the channel regions Rch, current flows from the drain electrode 56 to the source electrodes 54. In addition, when a potential lower than the threshold voltage is applied to the gate electrode 44, no inversion layer is formed in the channel regions Rch and current is cut off. Because of this configuration, the vertical MOSFET 1 is capable of switching current between the drain electrode 56 and the source electrodes 54.

(Manufacturing Method)

Next, a method for manufacturing the vertical MOSFETs 1 according to the first embodiment of the present disclosure will be described. FIGS. 5A to 5E are cross-sectional views illustrative of a method for manufacturing the vertical MOS-FETs 1 according to the first embodiment of the present disclosure in the sequence of steps. The vertical MOSFETs 1 are manufactured using various types of manufacturing apparatuses, such as an ion implantation apparatus, a heat treatment apparatus, a film forming apparatus, an exposure apparatus, and an etching apparatus.

Figure 5A:
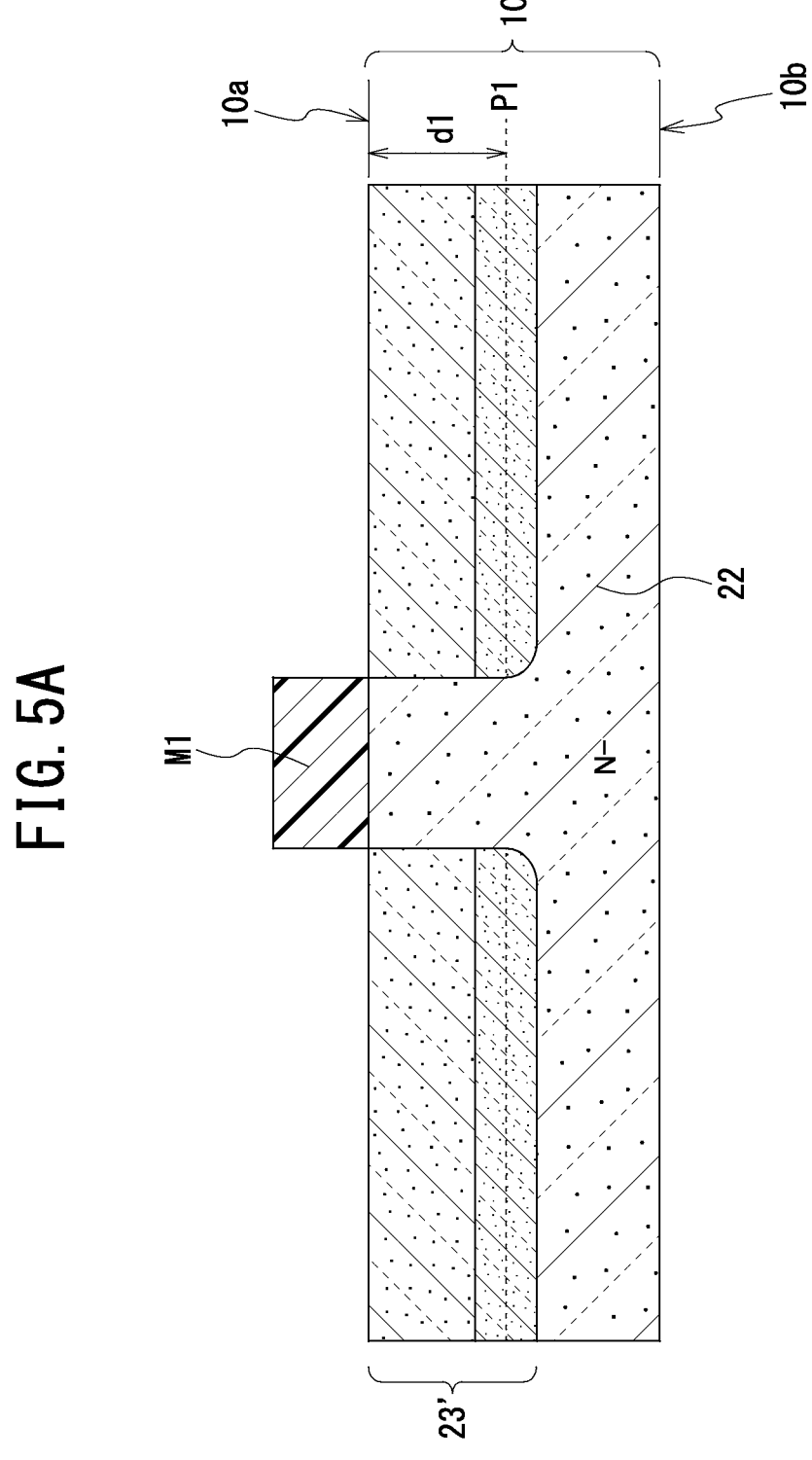
FIG. 5A is a cross-sectional view illustrative of a method for manufacturing the vertical MOSFET according to the first embodiment of the present disclosure in the sequence of steps.

As illustrated in FIG. 5A, a manufacturing apparatus ion-implants Mg as P-type impurities into regions (herein-after, referred to as P-type formation regions) 23' in each of which an impurity region 23 of P-type (see FIG. 4) is designed to be formed in the the GaN substrate 10 from the front surface 10*a* side of the GaN substrate 10. Each of the P-type formation regions 23' is an example of a "preset region" of the present disclosure.

For example, the manufacturing apparatus forms a mask M1 on the front surface 10*a* of the GaN substrate 10. The mask M1 is a SiO$_2$ film or a photoresist that can be selectively removed from the GaN substrate 10. The mask M1 has a shape that opens areas over the P-type formation regions 23' and covers areas over the other regions. The manufacturing apparatus ion-implants Mg into the GaN substrate 10 on which the mask M1 is formed.

In a Mg ion implantation step illustrated in FIG. 5A, implantation energy (acceleration voltage) and a dose amount of Mg are set in such a way that a position located distance d1 away from the front surface 10*a* in the vertical direction perpendicular to the front surface 10*a* of the GaN substrate 10 (for example, the Z-axis direction) is a peak position P1 at which the amount of implanted Mg ions reaches a maximum and the Mg concentration at the peak position P1 is a preset value. The distance d1 from the front surface 10*a* of the GaN substrate 10 to the peak position P1 is 200 nm or more and 1500 nm or less and is, as an example, 500 nm or more and 1500 nm or less. In addition, the above-described preset value is $5 \times 10^{18}$ cm$^{-3}$ or more, pref-erably $8 \times 10^{18}$ cm$^{-3}$ or more, and more preferably $1 \times 10^{19}$ cm$^{-3}$ or more after heat treatment for Mg activation (see FIG. 5C, which will be described later).

Note that the Mg ion implantation step illustrated in FIG. 5A may be performed by one-step ion implantation in which acceleration energy is applied in accordance with one con-dition or multi-step ion implantation in which acceleration energy is applied in accordance with a plurality of condi-tions.

In addition, in the step illustrated in FIG. 5A, the manufacturing apparatus ion-implants an inert element (for example, at least one of nitrogen (N) and argon (Ar)) into the P-type formation regions 23' from the front surface 10a side of the GaN substrate 10 around the same time as the Mg ion implantation step. For example, the manufacturing apparatus ion-implants N as the inert element into the P-type formation regions 23' from the front surface 10a side of the GaN substrate 10. In the N ion implantation step, implantation energy (acceleration voltage) of N is set in such a way that a peak position of the amount of implanted N ions coincides with the peak position P1 of the amount of implanted Mg ions in the vertical direction to the front surface 10a of the GaN substrate 10 (for example, the Z-axis direction). The ion implantation of N causes vacancies to be formed in a Mg implantation region (a region between the front surface 10a of the GaN substrate 10 and the peak position P1 of the amount of implanted Mg ions).

Note that, in the N ion implantation step, the implantation energy (acceleration voltage) of N may be set in such a way that the peak position of the amount of implanted N ions is located between the front surface 10a (that is, a position serving as the above-described interface IF) of the GaN substrate 10 and the peak position P1 of the amount of implanted Mg ions in the vertical direction to the front surface 10a of the GaN substrate 10 (for example, the Z-axis direction).

The amount of implanted N ions is 0.1 times or more and 10 times or less the amount of implanted Mg ions. As an example, the implantation energy and the dose amount of N may be set in such a way that the peak position of the amount of implanted N ions coincides with the peak position P1 of the amount of implanted Mg ions and the amount of implanted N ions at the peak position P1 is the same value (that is, 1 time) as the amount of implanted Mg ions.

Note that, as with the Mg ion implantation step, the N ion implantation step may also be performed by one-step ion implantation in which acceleration energy is applied in accordance with one condition or multi-step ion implantation in which acceleration energy is applied in accordance with a plurality of conditions.

After Mg and N are successively ion-implanted in the step illustrated in FIG. 5A, the manufacturing apparatus removes the mask M1 from the top of the GaN substrate 10.

Figure 5B:
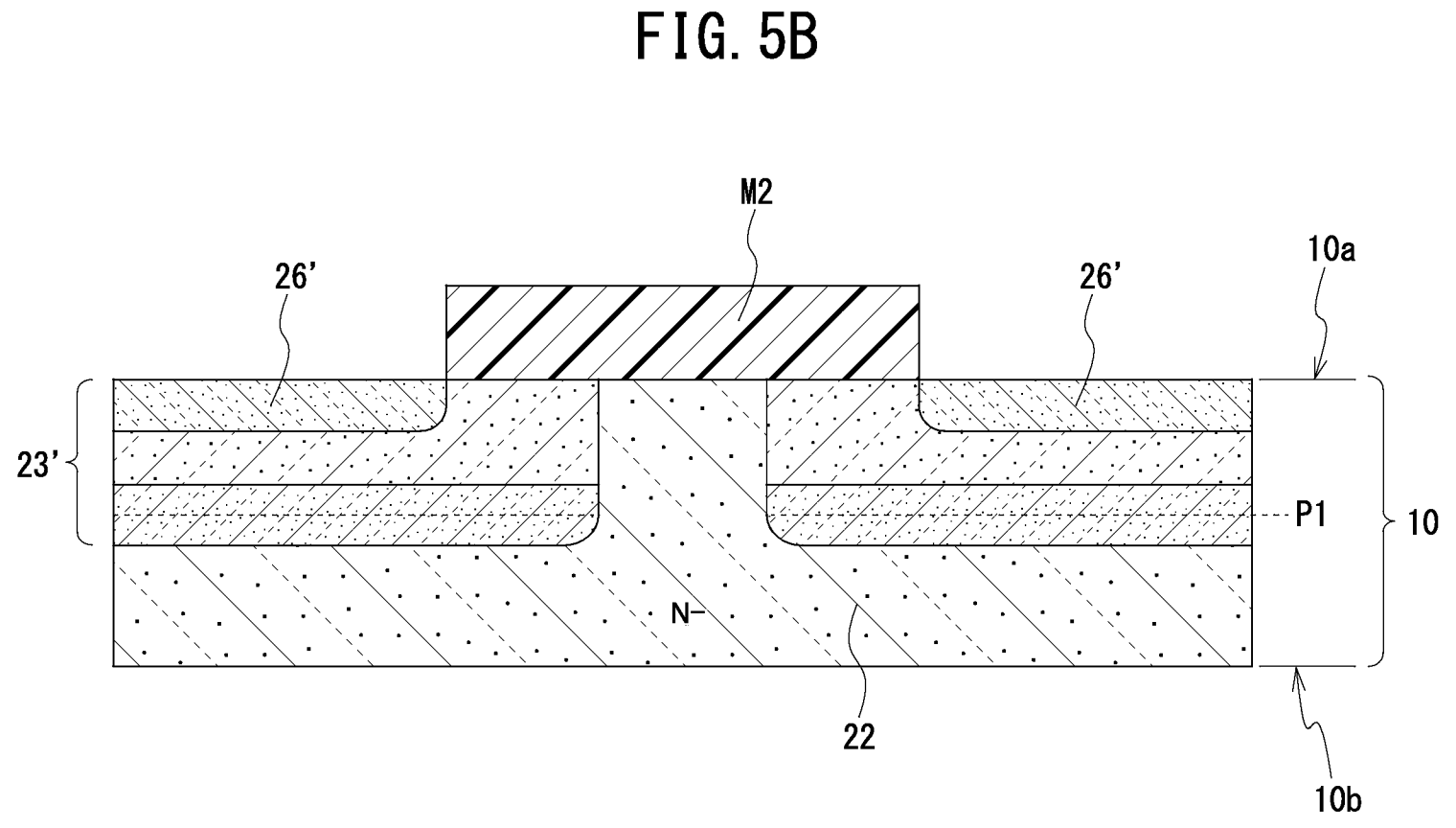

Next, as illustrated in FIG. 5B, the manufacturing apparatus ion-implants Si as N-type impurities into regions (hereinafter, referred to as source formation regions) 26' in each of which a source region 26 of N-type (see FIG. 4) is designed to be formed in the the GaN substrate 10. For example, the manufacturing apparatus forms a mask M2 on top of the GaN substrate 10. The mask M2 is a SiO₂ film or a photoresist. The mask M2 has a shape that opens areas over the source formation regions 26' and covers areas over the other regions. The manufacturing apparatus ion-implants N-type impurities (for example, silicon (Si) or oxygen (O)) into the GaN substrate 10 on which the mask M2 is formed. After the ion implantation, the manufacturing apparatus removes the mask M2 from the top of the GaN substrate 10.

In addition, around the same time as the ion implantation step of the N-type impurities into the source formation regions 26', the manufacturing apparatus ion-implants Mg as P-type impurities into regions (hereinafter, referred to as contact formation regions) in each of which a contact region 25 (see FIGS. 1 and 3) is designed to be formed in the the GaN substrate 10. For example, the manufacturing apparatus forms a mask (not illustrated) on top of the GaN substrate 10. The mask is a SiO₂ film or a photoresist. The mask has a shape that opens areas over the contact formation regions and covers areas over the other regions. The manufacturing apparatus ion-implants Mg into the GaN substrate 10 on which the mask is formed.

Figure 5C:
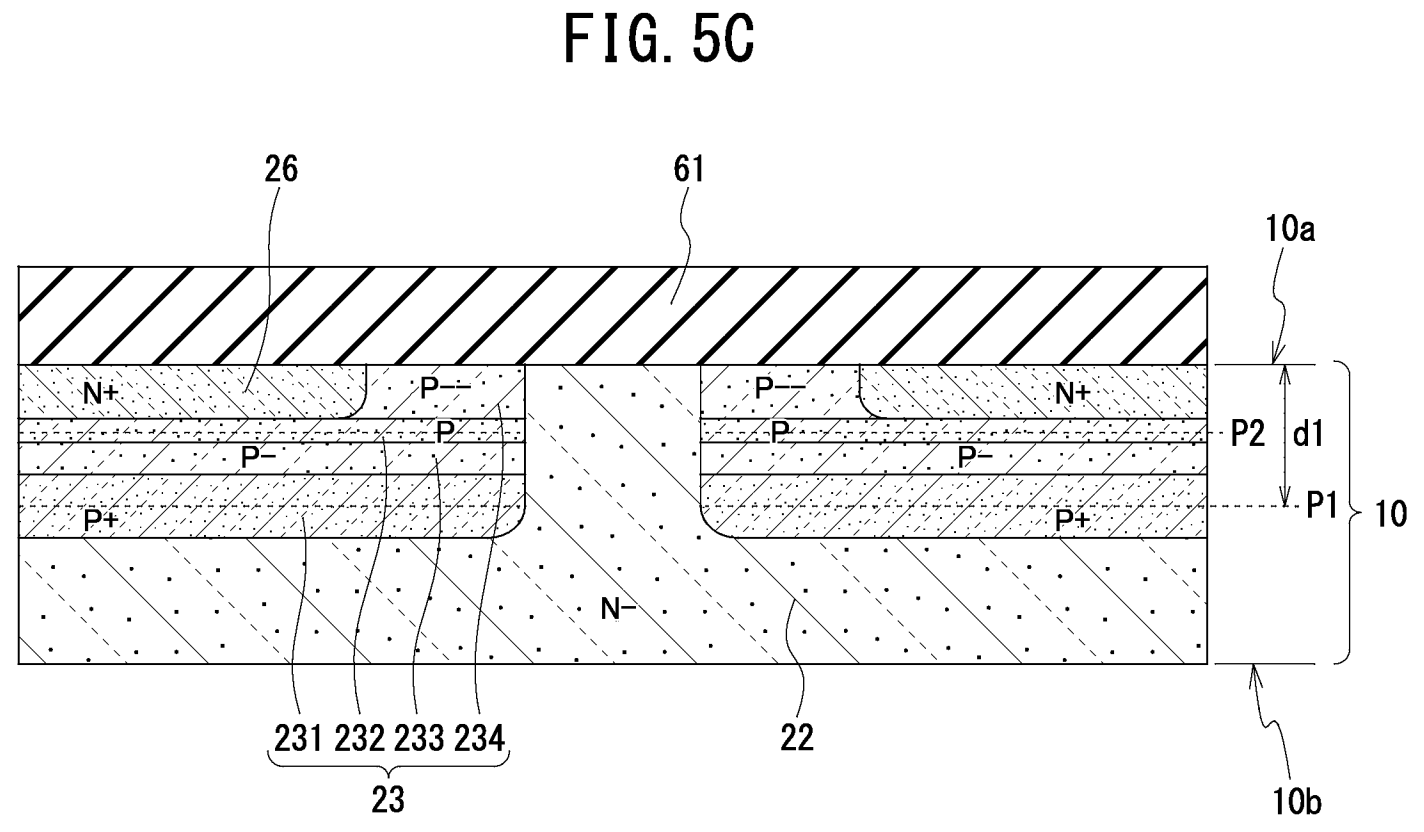

Next, as illustrated in FIG. 5C, the manufacturing apparatus forms an insulating protective film 61 on the front surface 10a of the GaN substrate 10. The protective film 61 has a function of preventing nitrogen atoms from being discharged from the GaN substrate 10 during heat treatment. At positions from which nitrogen atoms are discharged from the GaN substrate 10, nitrogen vacancies are formed. Since nitrogen vacancies can function as donor-type defects, there is a possibility that an appearance of P-type characteristics is inhibited. Aimed at preventing such an inconvenience, the manufacturing apparatus forms the protective film 61 on the GaN substrate 10.

It is preferable that the protective film 61 have a high heat resistance and have an excellent adhesiveness with the GaN substrate 10, impurities do not diffuse from the protective film 61 to the GaN substrate 10 side, and the protective film 61 be selectively removable from the GaN substrate 10. The protective film 61 is an aluminum nitride (AlN) film, a SiO₂ film, or a silicon nitride (SiN) film. The protective film 61 may be a stacked film including at least one or more of an AlN film, a SiO₂ film, and a SiN film. In addition, between the GaN substrate 10 and the protective film 61, an insulating film serving as a base layer of the protective film 61 may be formed. Examples of the insulating film serving as a base layer include a SiO₂ film.

Next, the manufacturing apparatus subjects the GaN substrate 10 covered by the protective film 61 to heat treatment with a maximum temperature of 800° C. or more and 2000° C. or less. This heat treatment is, for example, rapid heat treatment. The heat treatment causes the P-type impurities (for example, Mg) and the N-type impurities (for example, Si or O) introduced into the GaN substrate 10 to be activated. The activation causes the impurity regions 23 of P-type, the source regions 26 of N⁺-type, and the contact regions 25 of P⁺⁺-type (see FIGS. 1 and 3) to be formed and, at the same time, the drift region 22 to be defined in the GaN substrate 10, as illustrated in FIG. 5C. In addition, this heat treatment enables defects induced by the ion implantation to be repaired to some extent in the GaN substrate 10. After the heat treatment, the manufacturing apparatus removes the protective film 61 from the top of the GaN substrate 10.

Note that, in the heat treatment step for activation illustrated in FIG. 5C, Mg diffuses along vacancies formed by the ion implantation of N and, at the same time, Mg are captured in the vacancies (vacancy-guided diffusion). Since, at the time of the heat treatment for activation, a Mg capture region based on the vacancies is formed between the peak position P1 of Mg and the front surface 10a of the GaN substrate 10, Mg is prevented from diffusing from the peak position P1 of the Mg implantation to the front surface 10a of the GaN substrate 10.

Figure 5D:
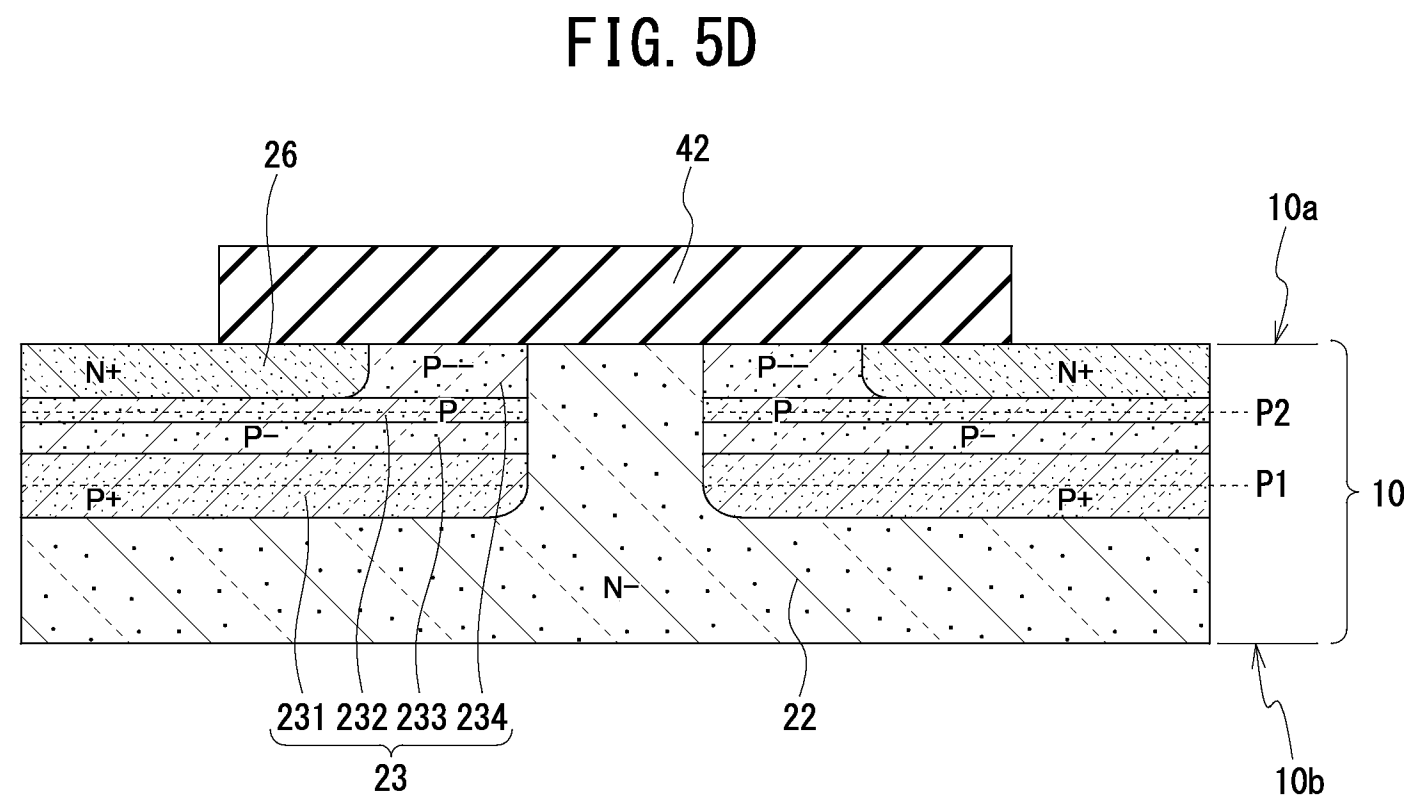
Figure 5E:
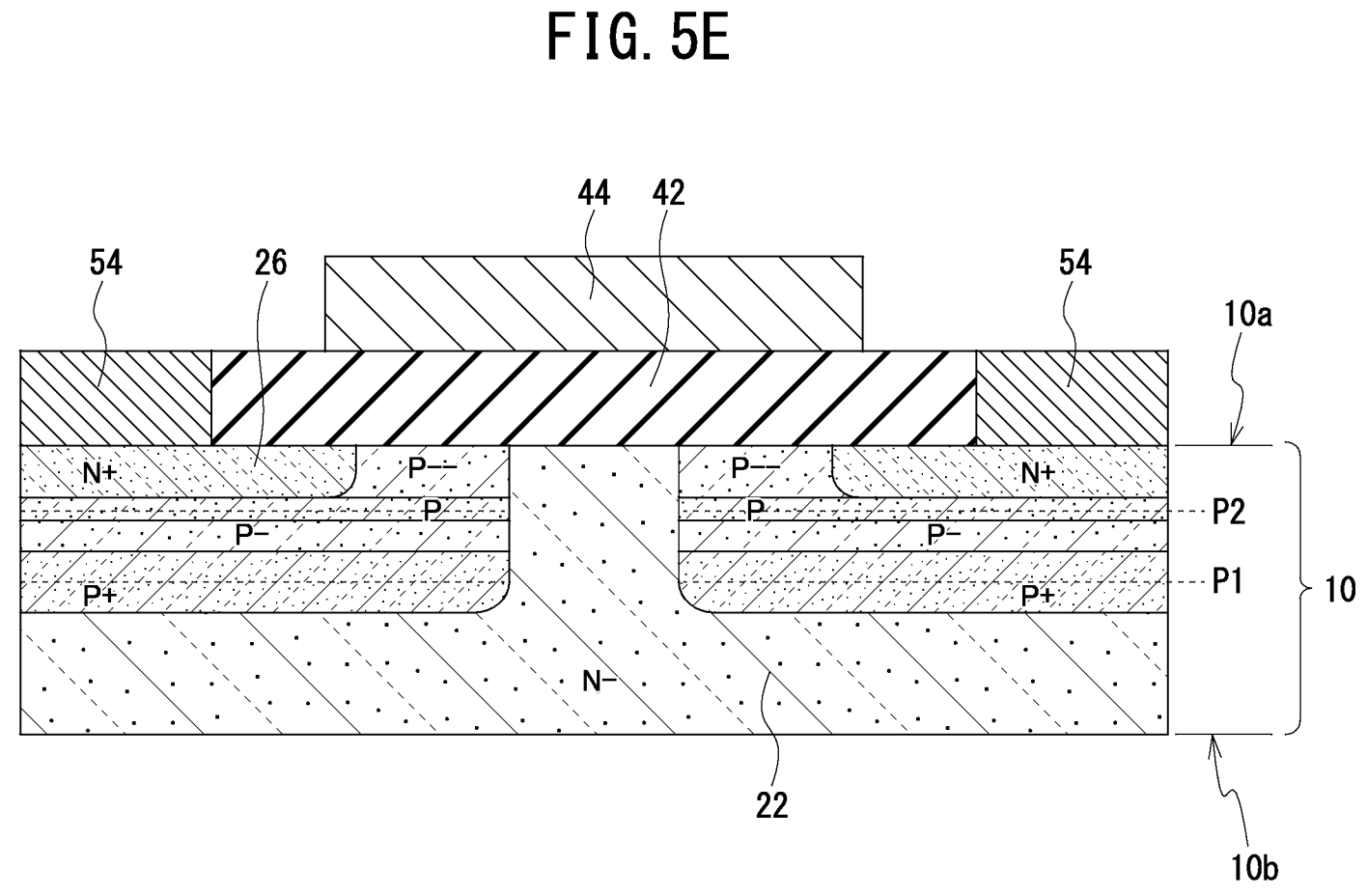

Next, as illustrated in FIG. 5D, the manufacturing apparatus forms the gate insulating films 42 on the GaN substrate 10. Next, as illustrated in FIG. 5E, the manufacturing apparatus forms the gate electrodes 44, the source electrodes 54, and the drain electrode 56 (see FIG. 4). Through the steps as described above, the vertical MOSFETs 1 illustrated in FIGS. 1 to 4 are completed.

Experimental Result

Figure 6:
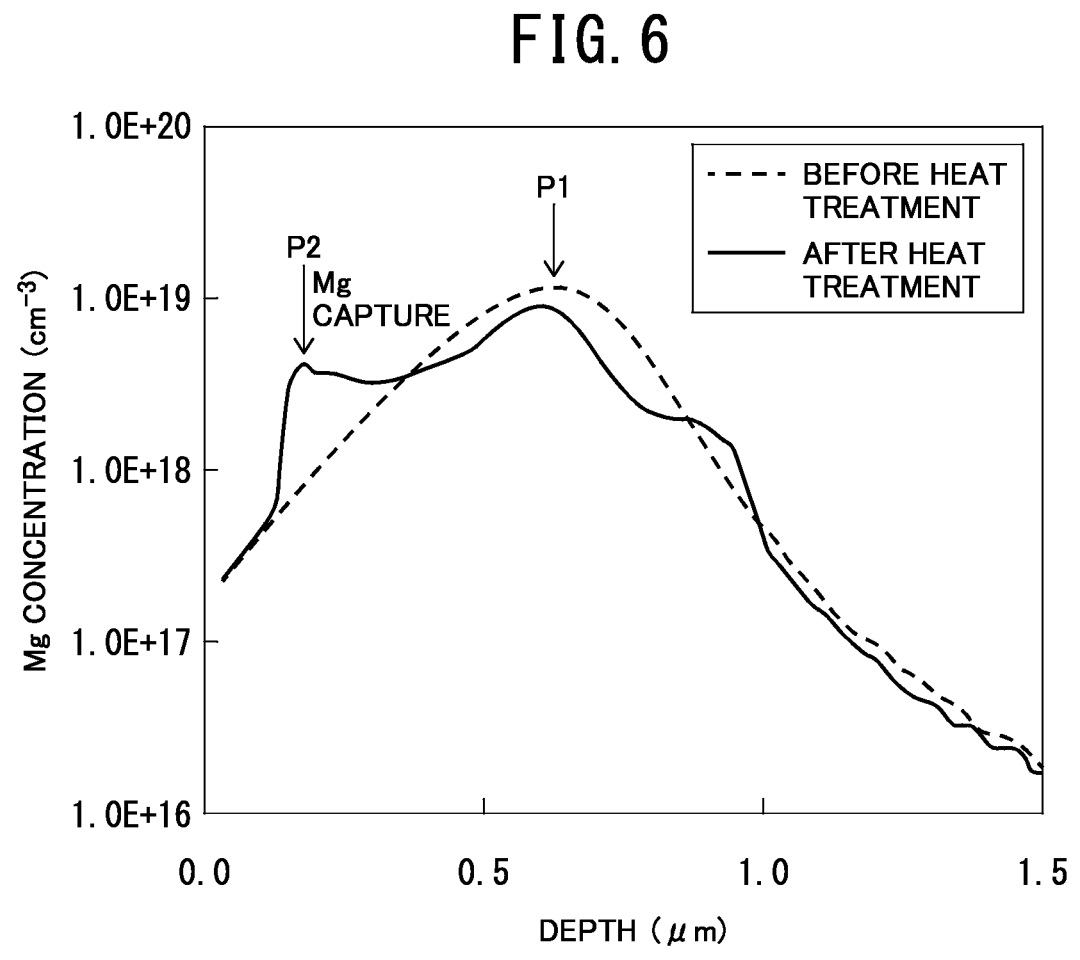
Figure 7:
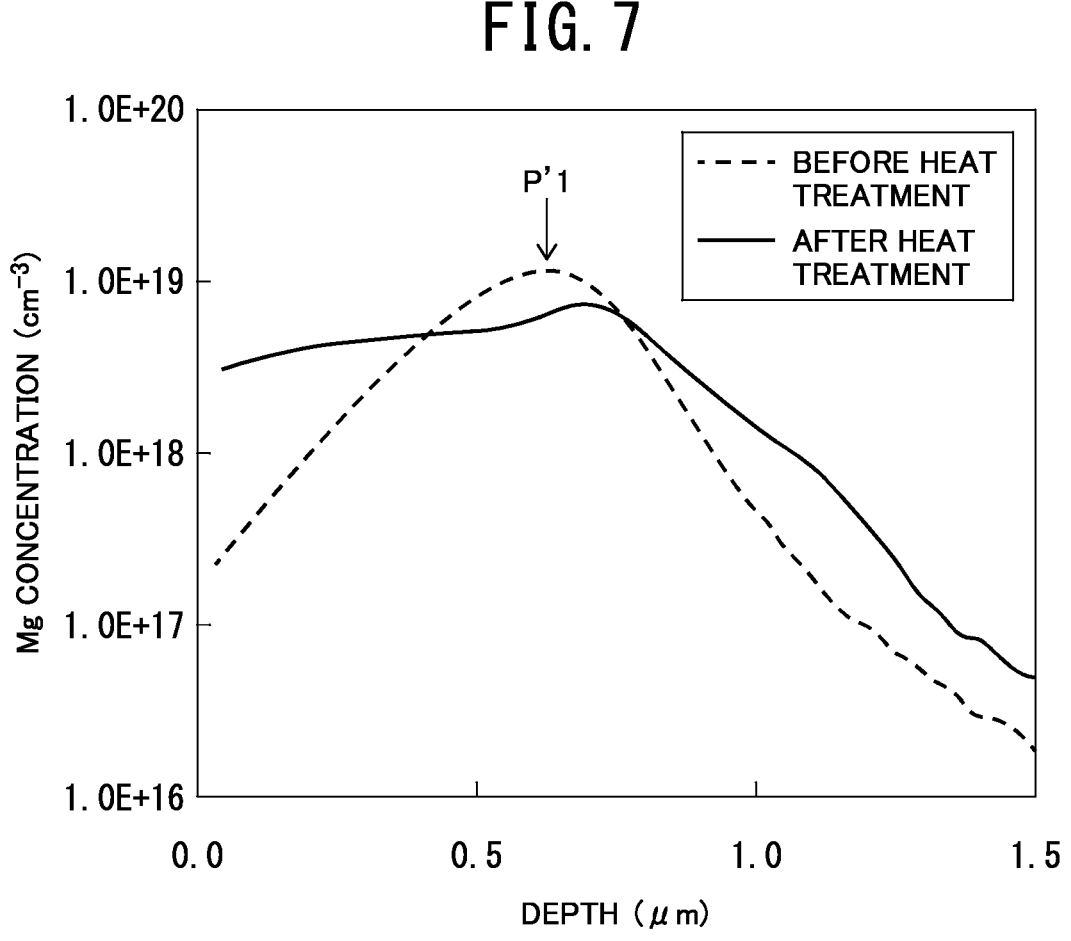
FIG. 7 is a graph illustrative of distributions of Mg concentration in the depth direction of a GaN substrate according to a comparative example of the present disclosure.

An experimental result on a distribution of Mg concentration in the depth direction of the GaN layer will be described. FIG. 6 is a graph illustrative of distributions of the Mg concentration in the depth direction of the GaN substrate according to an example of the present disclosure. FIG. 7 is a graph illustrative of distributions of the Mg concentration in the depth direction of a GaN substrate according to a comparative example of the present disclosure. The abscissas in FIGS. 6 and 7 represent depth (nm) from the front surfaces of GaN layers. The ordinates in FIGS. 6 and 7 represent Mg concentration ($cm^{-3}$) in the GaN layers.

In the example illustrated in FIG. 6, the ion implantation of Mg was performed under the condition that acceleration voltage was 700 keV (one-step implantation) and the dose amount of Mg was $4.2 \times 10^{14}$ $cm^{-2}$ and the ion implantation of N was also performed under the condition that acceleration voltage was 580 keV (one-step implantation) and the dose amount of N was $3 \times 10^{14}$ $cm^{-2}$. The Mg concentration in the depth direction of the GaN substrate was measured by secondary ion mass spectrometry (SIMS) with respect to before and after the heat treatment for activation.

In the comparative example illustrated in FIG. 7, while the ion implantation of Mg was performed under the same condition as the example, the ion implantation of N was not performed. The Mg concentration in the depth direction of the GaN substrate was measured by SIMS with respect to before and after the heat treatment for activation.

As illustrated in FIGS. 6 and 7, it is revealed that, in the example and the comparative example, Mg tends to diffuse to the front surface side of the GaN layer by the above-described heat treatment. However, in the example, a local peak position P2 at which the Mg concentration reaches a local maximum appeared between the front surface of the GaN substrate and the peak position P1 of the Mg ion implantation at which the Mg concentration reaches a maximum after the heat treatment. It is considered that the local peak position P2 of Mg is formed by vacancies formed by the ion implantation of N being clustered by the heat treatment and Mg being captured in the region.

In the example, Mg is captured between the front surface of the GaN substrate and the peak position P1. As a result, it is revealed that, in the example, it is possible to maintain each of the Mg concentration at the front surface of the GaN substrate and the Mg concentration at the peak position P1 at a concentration close to a concentration at the time of the Mg ion implantation (that is, before the heat treatment).

In contrast, in the comparative example, the ion implantation of N is not performed, and vacancy formation due to the ion implantation of N is also not performed. Thus, as illustrated in FIG. 7, in the comparative example, a local peak position P2 of Mg like the one in the example is not formed. It is revealed that Mg ion-implanted into the GaN substrate intensely diffuses to the front surface side of the GaN substrate by the heat treatment and the Mg concentration at the front surface of the GaN substrate reaches a high value after the heat treatment.

When the Mg concentration at the front surface of the GaN substrate and in the vicinity thereof is high, the threshold voltage of the vertical MOSFET of N-type becomes high and there is a possibility that characteristics of the vertical MOSFET deteriorate. For example, although, in order to cause the vertical MOSFET to operate in a normally-off mode, a threshold voltage of 3 V or more is required, mobility decreases as the threshold voltage increases. The threshold voltage and the mobility have a trade-off relationship. Decrease in the mobility is undesirable for the characteristics of the vertical MOSFET.

In addition, in the comparative example, a tendency that the Mg concentration at a peak position P'1 at which the Mg concentration reaches a maximum in the Mg ion implantation decreases after the heat treatment was observed. As evident from the comparison between FIGS. 6 and 7, the tendency is more prominent in the comparative example than in the example. When decrease in the Mg concentration at the peak position P'1 is large, width of a depletion layer extending from the P$^+$-type region including the peak position P'1 to the N-type GaN substrate side becomes small and there is a possibility that the breakdown voltage of the vertical MOSFET decreases.

Advantageous Effects of Embodiment

As described in the foregoing, the GaN semiconductor device 100 according to the first embodiment of the present disclosure includes the GaN substrate 10 and the vertical MOSFETs 1 of the planar gate type that are formed in the GaN substrate 10. The GaN substrate 10 has the front surface 10a and the back surface 10b that is located on the opposite side to the front surface 10a. Each of the vertical MOSFETs 1 includes the gate insulating film 42 that is formed on the front surface 10a side of the GaN substrate 10 and the impurity regions 23 of P-type that are formed in the GaN substrate 10 and are in contact with the gate insulating film 42.

Each of the impurity regions 23 of P-type is, for example, a well region of P-type and has a peak position P1 at which the concentration of P-type impurities (for example, Mg) reaches a maximum at a position located away from the interface IF between the impurity region 23 and the gate insulating film 42. In the vertical direction perpendicularly intersecting the interface IF between the impurity region 23 and the gate insulating film 42 (for example, the Z-axis direction), the distance d1 from the interface IF to the peak position P1 is 200 nm or more and 1500 nm or less. The Mg concentration at the peak position P1 is $5 \times 10^{18}$ $cm^{-3}$ or more. The Mg concentration at the interface IF of the impurity region 23 is $1 \times 10^{16}$ $cm^{-3}$ or more and $3 \times 10^{18}$ $cm^{-3}$ or less.

In addition, the impurity region 23 has an inflection point at which the Mg concentration changes from increase to decrease toward the interface IF or the rate of decrease in the Mg concentration increases toward the interface IF at a position that is located between the interface IF and the peak position P1 and is located away respectively from the interface IF and from the peak position P1. The inflection point is a starting point at which the Mg concentration starts rapidly decreasing toward the interface IF. The inflection point is, for example, a local peak position P2 at which the Mg concentration reaches a local maximum. The Mg concentration at the peak position P2, which is an inflection point, is $3 \times 10^{18}$ $cm^{-3}$ or more and a Mg concentration value at the peak position P1 or less.

The local peak position P2 is formed by Mg being captured in vacancies at the time of heat treatment for activating Mg. The local peak position P2 is, for example, a protruding region where a Mg profile inflects, as illustrated in FIG. 6. The formation of the local peak position P2 causes Mg to be prevented from diffusing to the front surface 10a side of the GaN substrate 10, which enables the Mg concentration at the interface IF between the front surface 10a of the GaN substrate 10 and the gate insulating film 42 and in the vicinity thereof to be suppressed to a low level. Because of this effect, it is possible to prevent, for example, the threshold voltage of the vertical MOSFET 1 of N-type from unintentionally increasing and the mobility thereof from unintentionally decreasing, and it becomes easier to control the threshold voltage and the mobility within appropriate ranges. As a result, it is possible to provide a vertical MOSFET 1 the characteristics of which are prevented from deteriorating.

In addition, the Mg concentration at the peak position P1 of the GaN substrate 10 is $5 \times 10^{18}$ cm$^{-3}$ or more, preferably $8 \times 10^{18}$ cm$^{-3}$ or more, and more preferably $1 \times 10^{19}$ cm$^{-3}$ or more. As a result, it is possible to provide a vertical MOSFET 1 the breakdown voltage of which is maintained high.

The method for manufacturing the GaN semiconductor device 100 according to the first embodiment of the present disclosure includes a step of ion-implanting Mg into preset regions (for example, the P-type formation regions 23') in the GaN substrate 10 from the front surface 10a side of the GaN substrate 10, a step of ion-implanting N into the P-type formation regions 23' from the front surface 10a side of the GaN substrate 10, a step of activating Mg by subjecting the GaN substrate 10 into which Mg and N are ion-implanted to heat treatment and thereby forming the impurity regions 23 of P-type in the GaN substrate 10, and a step of forming the gate insulating films 42 on the front surface 10a side of the GaN substrate 10 into which the impurity regions 23 of P-type are formed. In the step of ion-implanting Mg, Mg is ion-implanted in such a way that a position that is located 200 nm or more and 1500 nm or less away from the interface IF between the impurity regions 23 and the gate insulating film 42 in the vertical direction perpendicularly intersecting the interface IF (for example, the Z-axis direction) becomes the peak position P1 of the amount of implanted Mg ions and the Mg concentration after the heat treatment at the peak position P1 is $5 \times 10^{18}$ cm$^{-3}$ or more.

According to the method, ion-implanting N from the front surface 10a side of the GaN substrate 10 enables a large number of vacancies to be introduced in the GaN substrate 10. The vacancies are clustered and capture Mg between the front surface 10a of the GaN substrate 10 and the peak position P1 at the time of the heat treatment for activation of Mg. Because of this effect, as illustrated in, for example, FIG. 6, it is possible to form a local peak position P2 at which the Mg concentration reaches a local maximum between the front surface 10a of the GaN substrate 10 and the peak position P1.

Since Mg is captured at the local peak position P2 at the time of the heat treatment, it is possible to prevent Mg from diffusing from the local peak position P2 to the front surface 10a of the GaN substrate 10. As a result, it is possible to maintain the Mg concentration at the front surface 10a of the GaN substrate 10 at a concentration close to a concentration at the time of the ion implantation (that is, before the heat treatment). Since it becomes easier to control the threshold voltage and the mobility of a vertical MOSFET 1 of N-type within appropriate ranges, it is possible to provide a vertical MOSFET 1 the characteristics of which are prevented from deteriorating.

In addition, as illustrated in, for example, FIG. 6, it is also possible to maintain the Mg concentration at the peak position P1 of the GaN substrate 10 at a concentration close to a concentration at the time of the Mg ion implantation (that is, before the heat treatment). As a result, since the width of a depletion layer extending from the P$^+$-type region 231 including the peak position P1 to the drift region 22 can be enlarged, it is possible to provide a vertical MOSFET 1 the breakdown voltage of which is maintained high.

(Variations)
(1) First Variation

In the above-described embodiment, an aspect in which, as illustrated in, for example, FIG. 4, the P-type region 232, which is a portion of each of the impurity regions 23 of P-type, is in contact with the bottom portion of a source region 26 was described. However, in the first embodiment of the present disclosure, the positional relationship between the P-type region 232 and the source region 26 is not limited to the above description.

Figure 8:
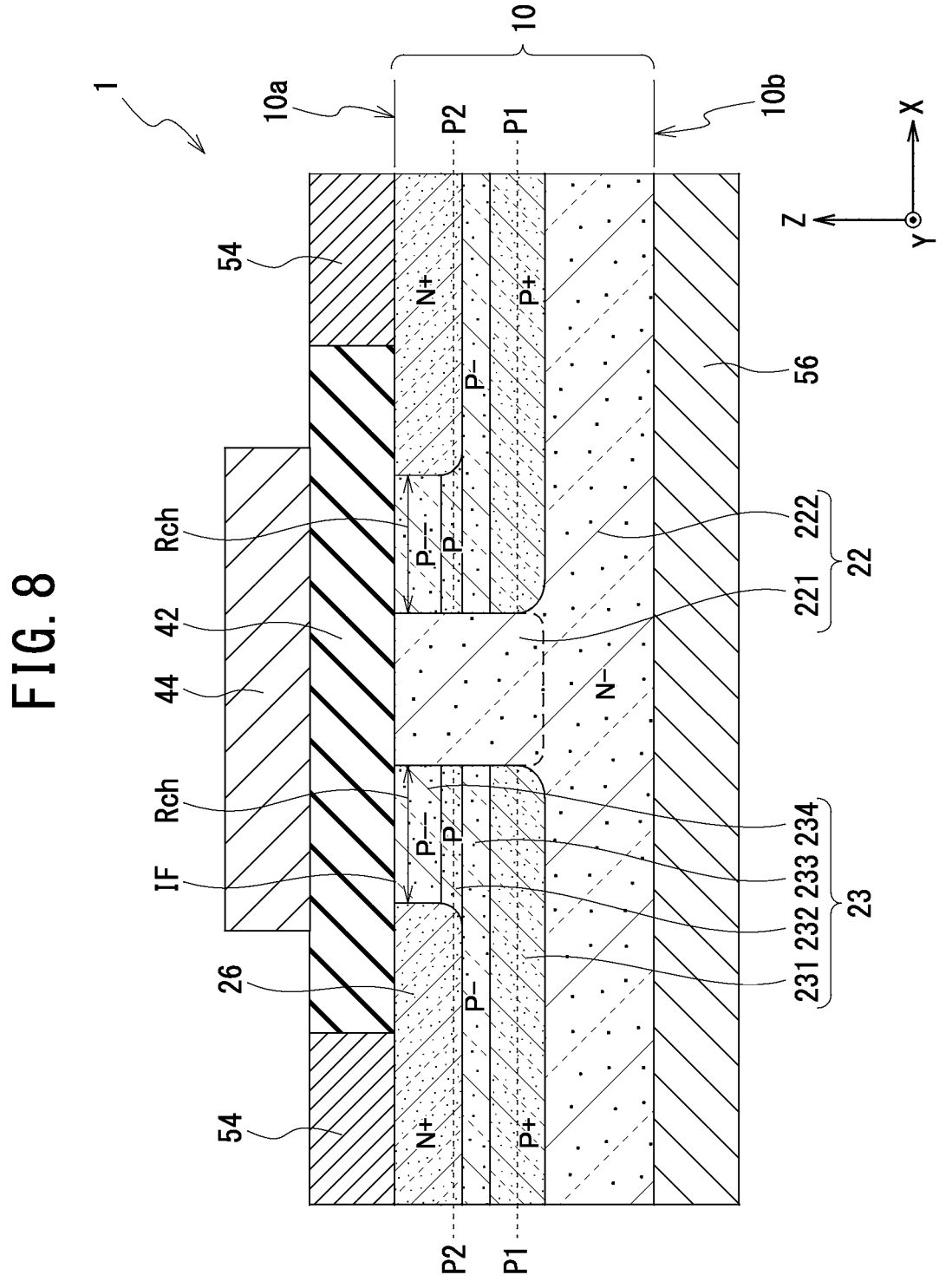
FIG. 8 is a cross-sectional view illustrative of a first variation of the vertical MOSFET according to the first embodiment of the present disclosure.

FIG. 8 is a cross-sectional view illustrative of a first variation of the vertical MOSFET 1 according to the first embodiment of the present disclosure. As illustrated in FIG. 8, in the vertical MOSFET 1 according to the first embodiment, each of the P-type regions 232 may be in contact with not the bottom portion but a side portion of a source region 26. Even in such a configuration, a local peak position P2 exists between the P$^+$-type region 231 and the interface IF. Because of this configuration, the first variation achieves the same advantageous effects as those of the embodiment.

(2) Second Variation

In the above-described embodiment, an aspect in which, as illustrated in FIG. 1, a plurality of contact regions 25 are arranged in line in the X-axis direction when viewed in plan was described. However, in the first embodiment of the present disclosure, the arrangement of the contact regions 25 is not limited to the above description.

Figure 9:
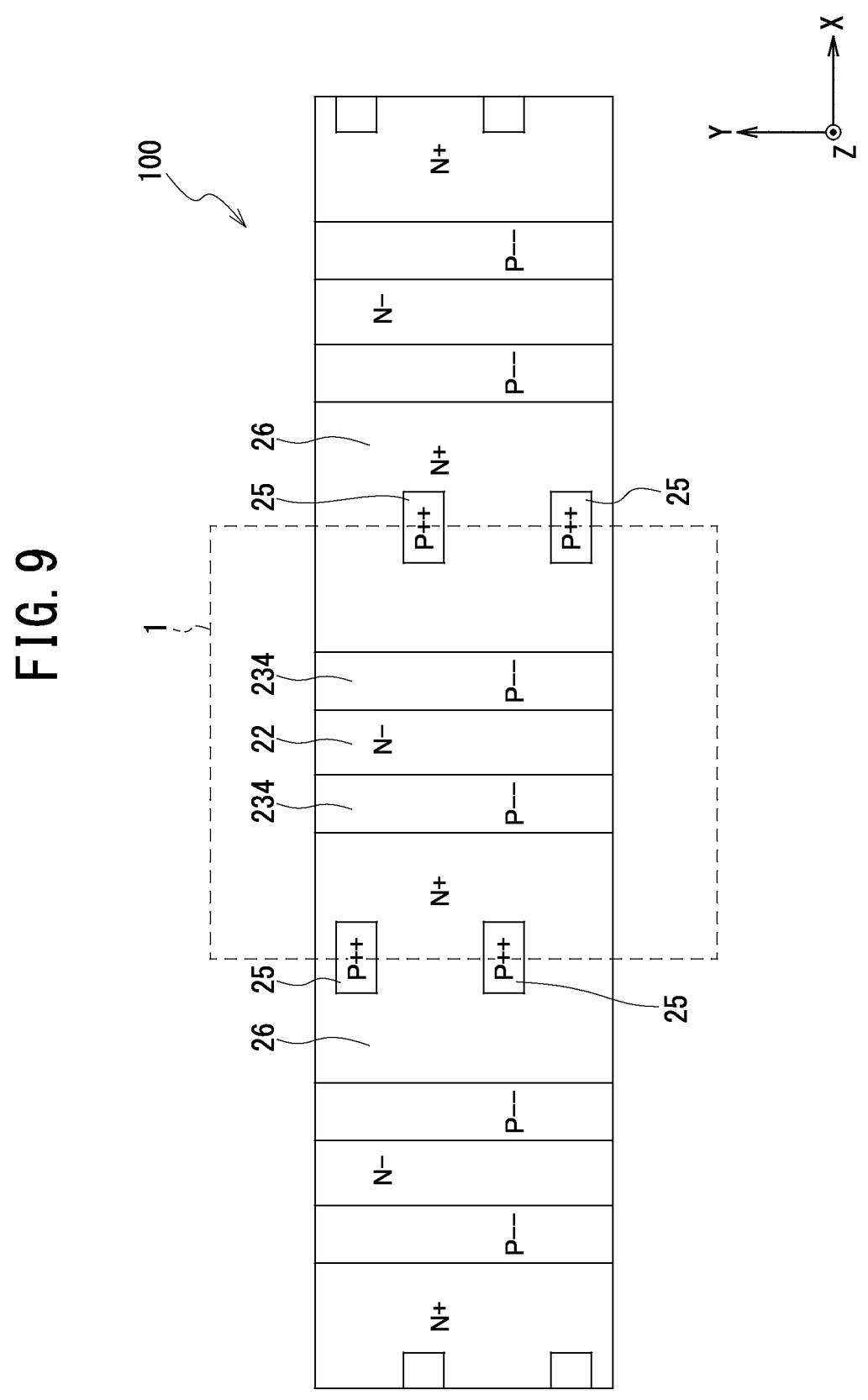
FIG. 9 is a plan view illustrative of a second variation of the vertical MOSFET according to the first embodiment of the present disclosure.

FIG. 9 is a plan view illustrative of a second variation of the vertical MOSFETs 1 according to the first embodiment of the present disclosure. As illustrated in FIG. 9, in the vertical MOSFETs 1 according to the first embodiment, the plurality of contact regions 25 may be arranged in line in the X-axis direction in such a manner as to be alternately staggered in the Y-axis direction. That is, one contact region 25 and the other contact region 25 that are adjacent to each other with a JFET region 221 of N$^-$-type interposed therebetween may be arranged in such a manner as to face each other in a direction inclined with respect to the X-axis direction when viewed in plan. Even in such a configuration, it is possible to form an ohmic connection between each of the source electrodes 54 and one of the impurity regions 23 via a contact region 25. The second variation achieves the same advantageous effects as those of the above-described embodiment.

Second Embodiment

In the above-described first embodiment, it was described that the vertical MOSFETs 1 had a planar gate structure. However, in embodiments of the present disclosure, the gate structure of vertical MOSFETs is not limited to the planar gate structure. In an embodiment of the present disclosure, a vertical MOSFET may be of a trench gate type in which a gate electrode is arranged in a trench formed in a GaN substrate with a gate insulating film interposed therebetween.

Configuration Example

Figure 10:
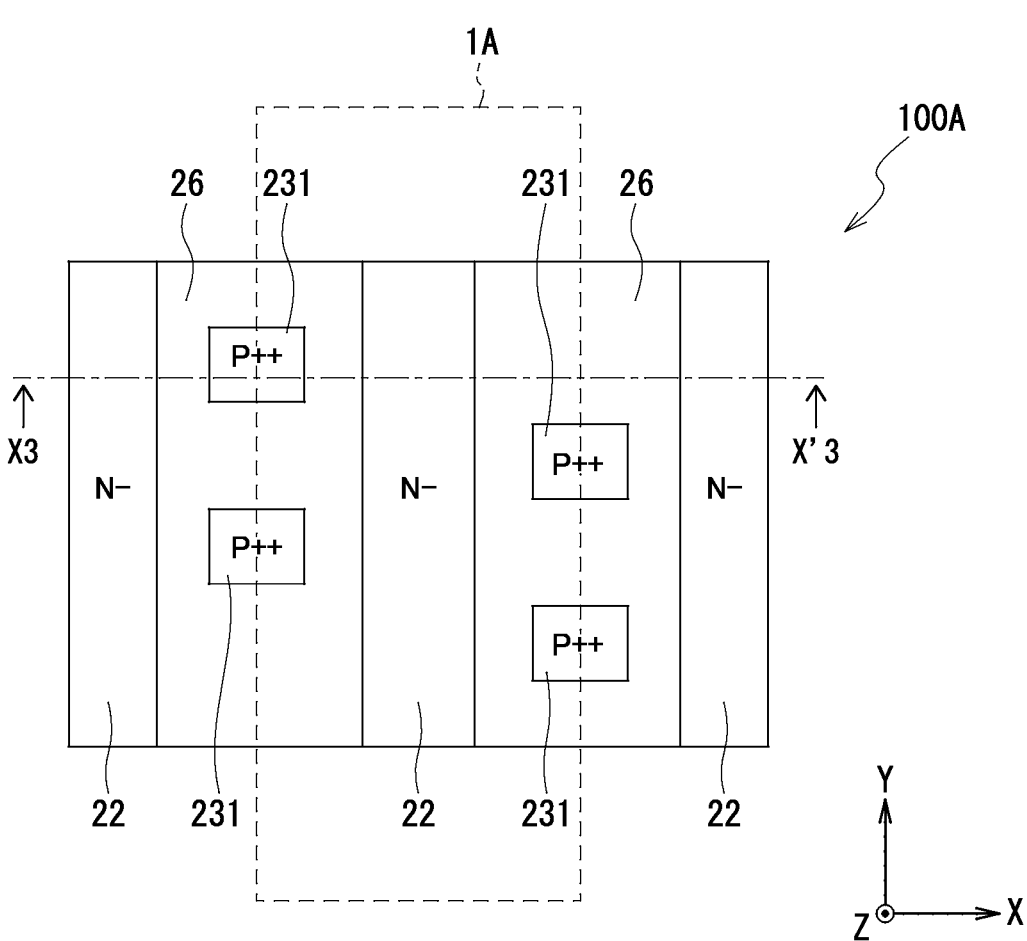
FIG. 10 is a plan view illustrative of a configuration example of a GaN semiconductor device according to a second embodiment of the present disclosure.
Figure 11:
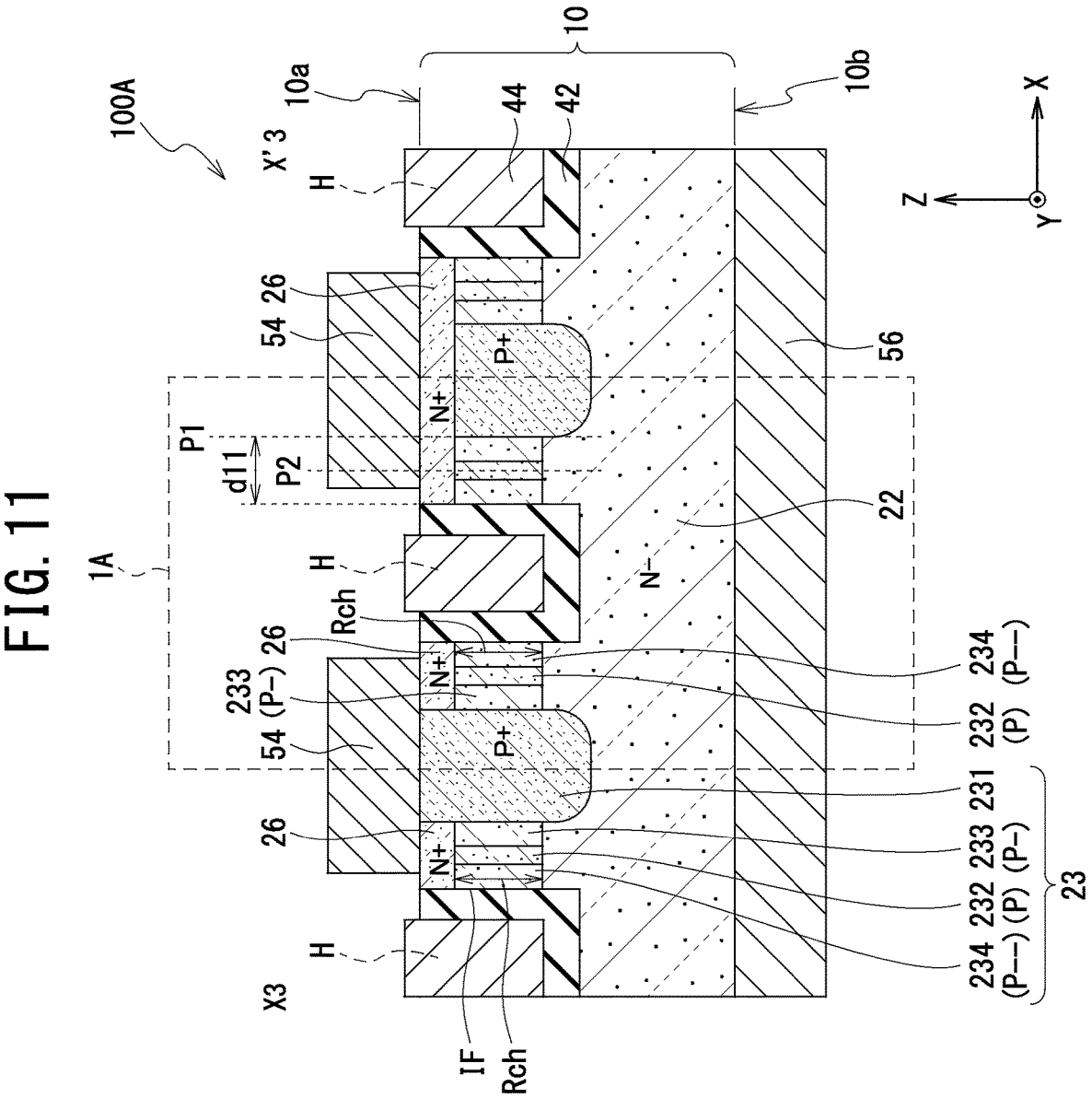
FIG. 11 is a cross-sectional view illustrative of the configuration example of the GaN semiconductor device according to the second embodiment of the present disclosure.

FIG. 10 is a plan view illustrative of a configuration example of a GaN semiconductor device 100A (an example of the "nitride semiconductor device" of the present disclosure) according to a second embodiment of the present disclosure. FIG. 11 is a cross-sectional view illustrative of the configuration example of the GaN semiconductor device 100A according to the second embodiment of the present disclosure. FIG. 11 illustrates a cross-section of the plan view in FIG. 10 taken along the line X3-X'3 of FIG. 10, which is parallel with the X-axis.

The GaN semiconductor device 100A illustrated in FIGS. 10 and 11 is a power device. In the GaN semiconductor device 100A, vertical MOSFETs 1A (an example of the "field effect transistor" of the present disclosure) are formed. A plurality of vertical MOSFETs 1A are repeatedly formed in one direction (for example, the X-axis direction). One vertical MOSFET 1A is a unit structure of the repeat, and the unit structures are arranged in line in one direction (for example, the X-axis direction).

Each of the vertical MOSFETs 1A is a MOSFET of the trench gate type and has a trench H formed in a gallium nitride substrate 10. The trenches H open on the front surface 10*a* side of the GaN substrate 10. The bottom surfaces of the trenches H reach a drift region 22 of N⁻-type. On the inside of each of the trenches H, a gate electrode 44 is arranged with a gate insulating film 42 interposed therebetween. Channels of each of the vertical MOSFETs 1A are formed in P⁻⁻-type regions 234 along the side surfaces of the trenches H.

In the vertical MOSFET 1A, P⁺-type regions 231 are formed from the front surface 10*a* side of the GaN substrate 10 in the depth direction (for example, the Z-axis direction). For example, each of the P⁺-type regions 231 is formed to a deeper position from the front surface 10*a* of the GaN substrate 10 than a trench H. The P⁺-type regions 231 enable charge concentration on the gate insulating film 42 on the bottom of the trenches H and the P⁻⁻-type regions 234 to be mitigated, which enables breakdown voltage of the vertical MOSFET 1A to be increased.

In addition, in the vertical MOSFET 1A, each of the P⁺-type regions 231 is partially exposed on the front surface 10*a* of the GaN substrate 10 and is in contact with a source electrode 54. Because of this configuration, the potential of an impurity region 23 including the P⁺-type region 231 is fixed at the potential of the source electrode 54 (for example, a ground potential).

(Manufacturing Method)

Next, a method for manufacturing the vertical MOSFETs 1A according to the second embodiment of the present disclosure will be described. FIGS. 12A to 12F are cross-sectional views illustrative of the method for manufacturing the vertical MOSFETs 1A according to the second embodiment of the present disclosure in the sequence of steps.

Figure 12A:
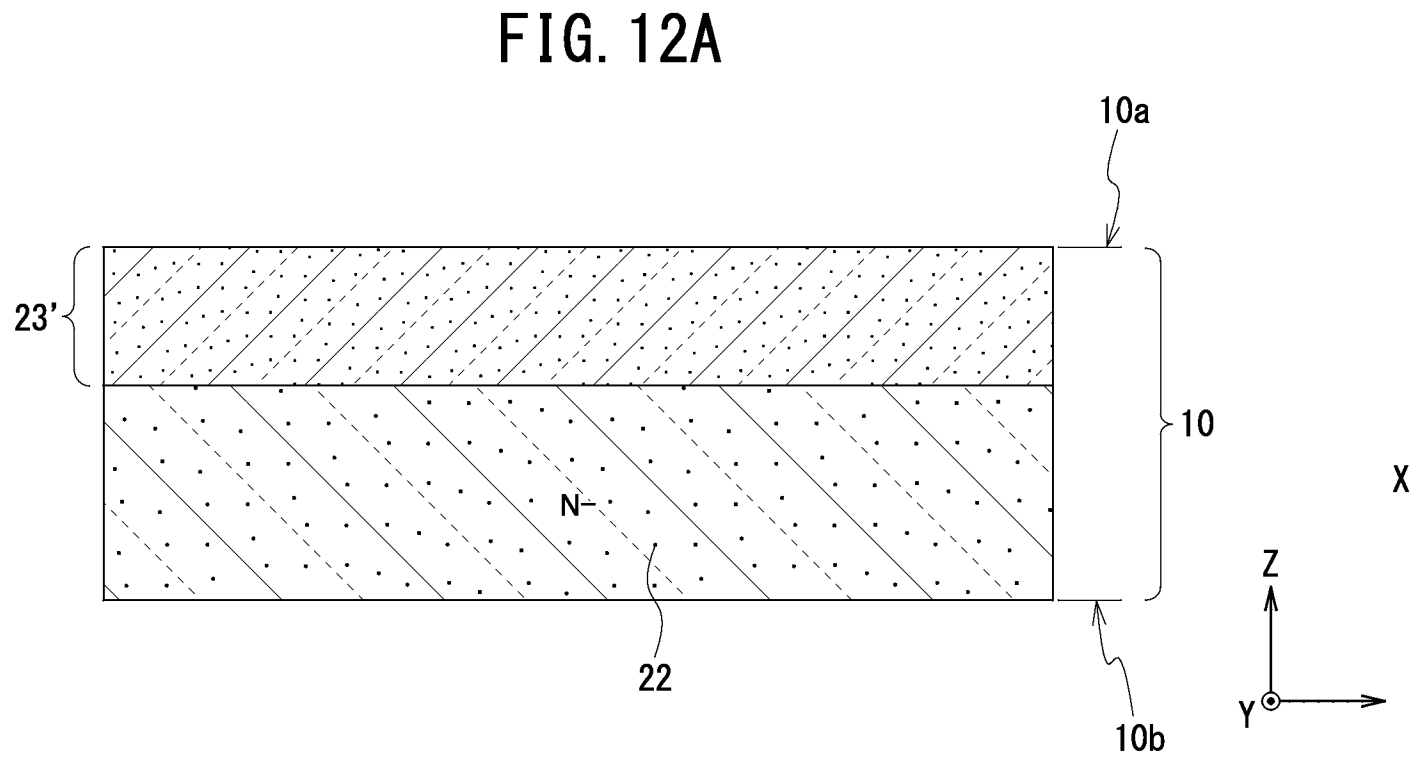

As illustrated in FIG. 12A, a manufacturing apparatus ion-implants Mg as P-type impurities into a region (that is, a P-type formation region) 23' in which impurity regions 23 of P-type (see FIG. 11) are designed to be formed in the the GaN substrate 10 from the front surface 10*a* side of the GaN substrate 10.

Figure 12B:
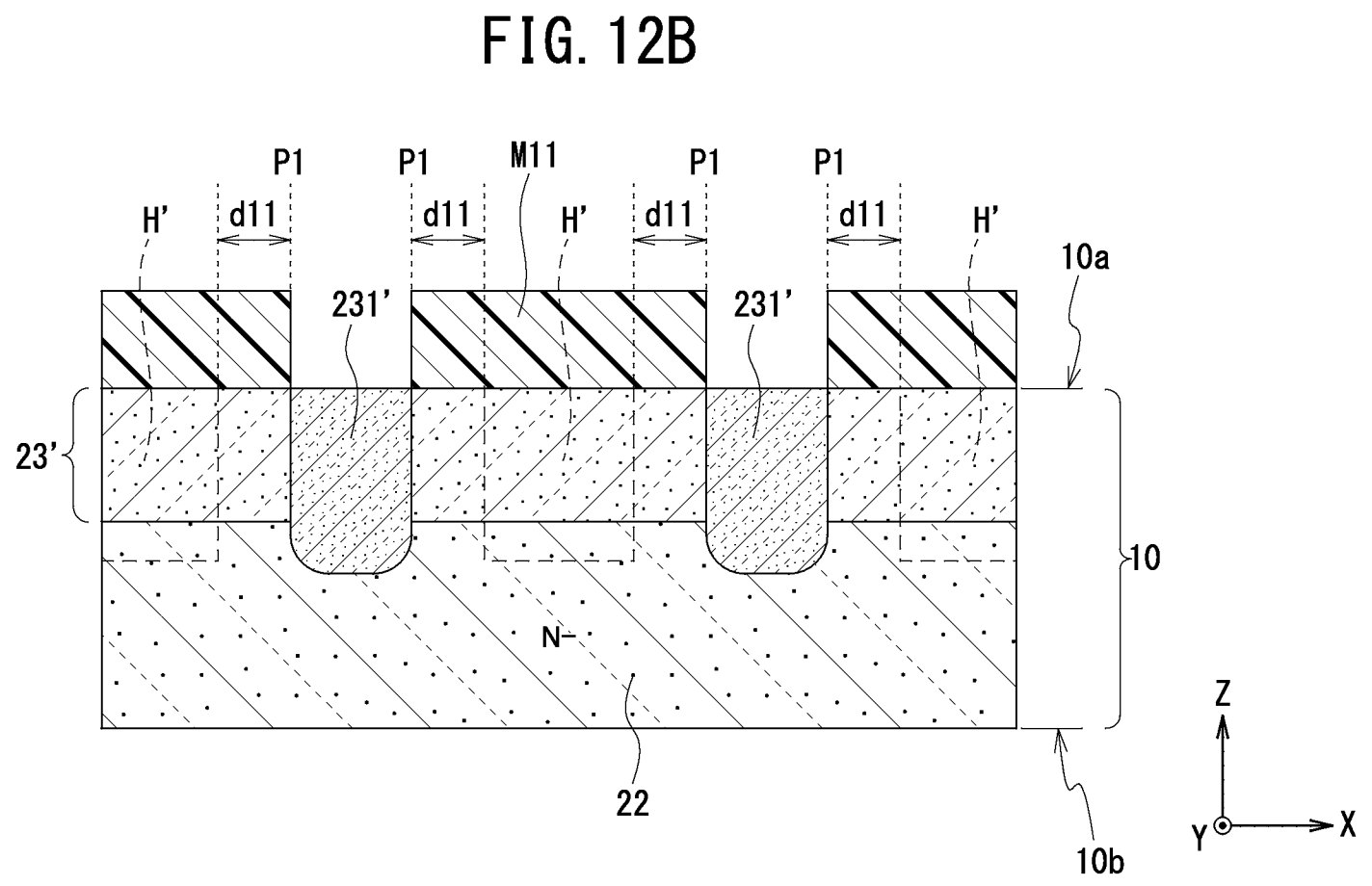

Next, as illustrated in FIG. 12B, the manufacturing apparatus forms a mask M11 on the front surface 10*a* of the GaN substrate 10. The mask M11 is a SiO₂ film or a photoresist that can be selectively removed from the GaN substrate 10. The mask M11 has a shape that opens areas over regions (hereinafter, referred to as P⁺-type formation regions) 231' in each of which a P⁺-type region 231 is designed to be formed within the P-type formation region 23' and covers areas over the other regions. When distance from an edge of a region (hereinafter, referred to as a trench formation region) H' in which a trench H is designed to be formed to an edge of a region of the mask M11 covering the trench formation region H' in the X-axis direction is denoted as d11, d11 is 200 nm or more and 1500 nm or less and is, as an example, 500 nm or more and 1500 nm or less.

Next, the manufacturing apparatus ion-implants Mg into the GaN substrate 10 on which the mask M11 is formed. In the ion implantation step, implantation energy (acceleration voltage) and a dose amount of Mg are set in such a way that, for example, Mg concentration in regions that are exposed from the mask M11 is controlled to a preset value in the P-type formation region 23'. The preset value is 5×10¹⁸ cm⁻³ or more, preferably 8×10¹⁸ cm⁻³ or more, and more preferably 1×10¹⁹ cm⁻³ or more after heat treatment for Mg activation (see FIG. 12D, which will be described later). The Mg ion implantation step may be performed by one-step ion implantation in which acceleration energy is applied in accordance with one condition or multi-step ion implantation in which acceleration energy is applied in accordance with a plurality of conditions.

In addition, in the step illustrated in FIG. 12B, the manufacturing apparatus ion-implants an inert element (for example, nitrogen (N) or argon (Ar)) into the GaN substrate 10 on which the Mask M11 is formed around the same time as the Mg ion implantation step. For example, the manufacturing apparatus ion-implants N as the inert element into the P-type formation regions 23' from the front surface 10*a* side of the GaN substrate 10.

In the N ion implantation step, the implantation energy (acceleration voltage) and the dose amount of N may be set in such a way that a profile similar to the one in the Mg ion implantation step is obtained. In addition, as with the Mg ion implantation step, the N ion implantation step may also be performed by one-step ion implantation in which acceleration energy is applied in accordance with one condition or multi-step ion implantation in which acceleration energy is applied in accordance with a plurality of conditions. The amount of implanted N ions is, for example, 0.1 times or more and 10 times or less the amount of implanted Mg ions.

After Mg and N are successively ion-implanted in the step illustrated in FIG. 12B, the manufacturing apparatus removes the mask M11 from the top of the GaN substrate 10.

Figure 12C:
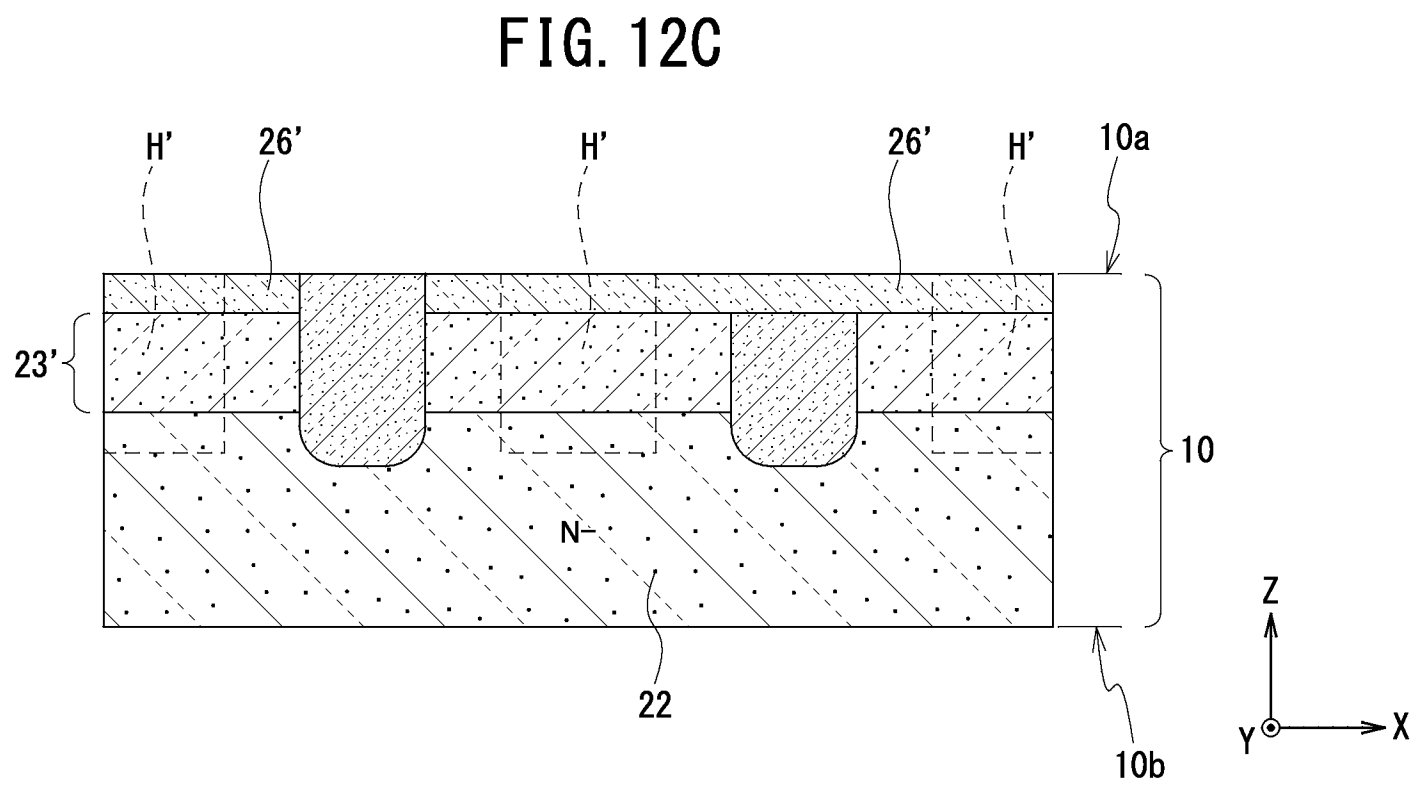

Next, as illustrated in FIG. 12C, the manufacturing apparatus ion-implants Si as N-type impurities into regions (hereinafter, referred to as source formation regions) 26' in each of which a source region 26 of N-type (see FIG. 11) is designed to be formed in the the GaN substrate 10.

Figure 12D:
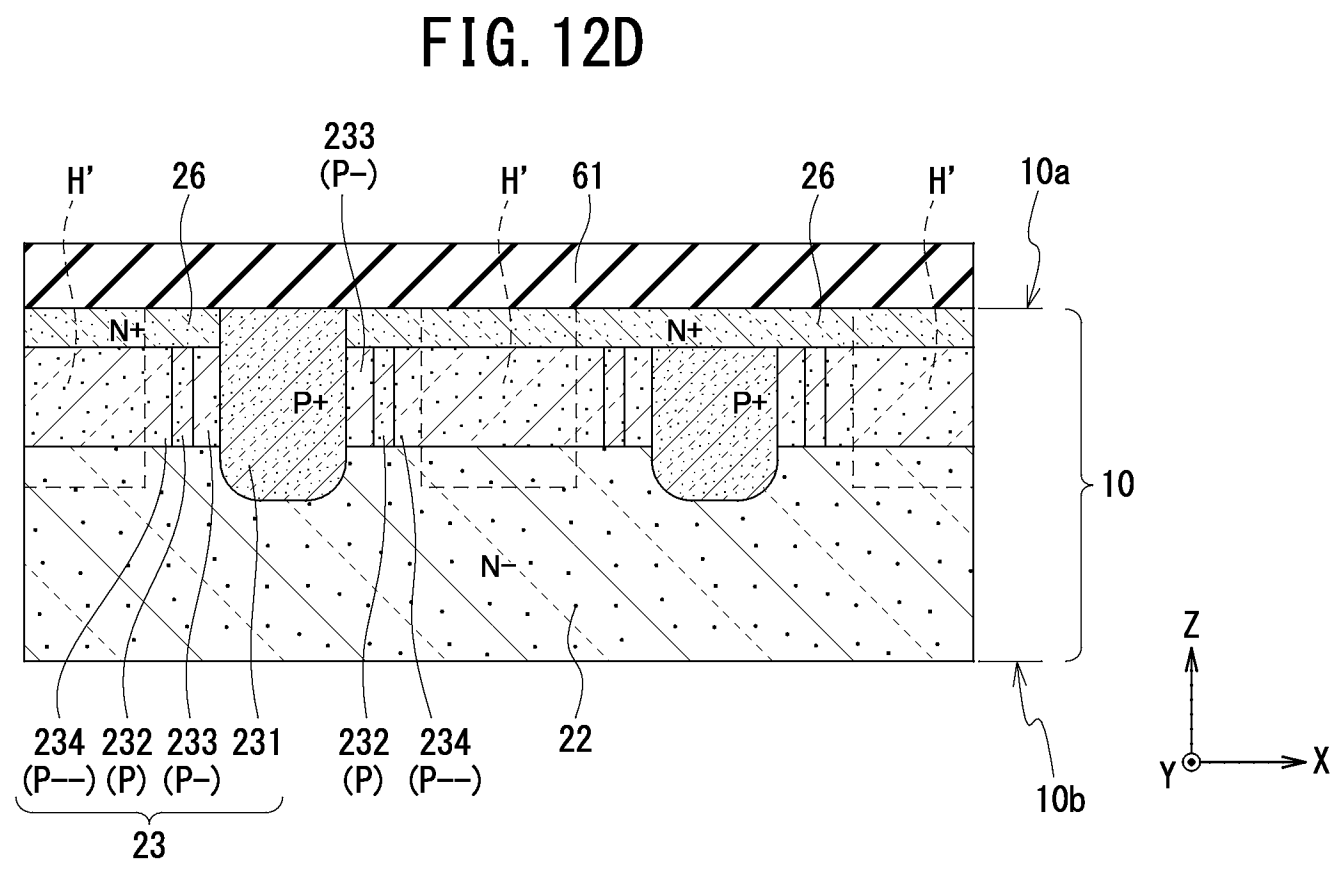

Next, as illustrated in FIG. 12D, the manufacturing apparatus forms a protective film 61 on the front surface 10*a* of the GaN substrate 10. Next, the manufacturing apparatus subjects the GaN substrate 10 covered by the protective film 61 to heat treatment with a maximum temperature of 800° C. or more and 2000° C. or less. This heat treatment is, for example, rapid heat treatment. The heat treatment causes the P-type impurities (for example, Mg) and the N-type impurities (for example, Si or O) introduced into the GaN substrate 10 to be activated and the impurity regions 23 of P-type and the source regions 26 of N⁺-type to be thereby formed and, at the same time, the drift region 22 to be defined in the GaN substrate 10. In addition, this heat treatment enables defects induced by the ion implantation to be repaired to some extent in the GaN substrate 10. After the heat treatment, the manufacturing apparatus removes the protective film 61 from the top of the GaN substrate 10.

Figure 12E:
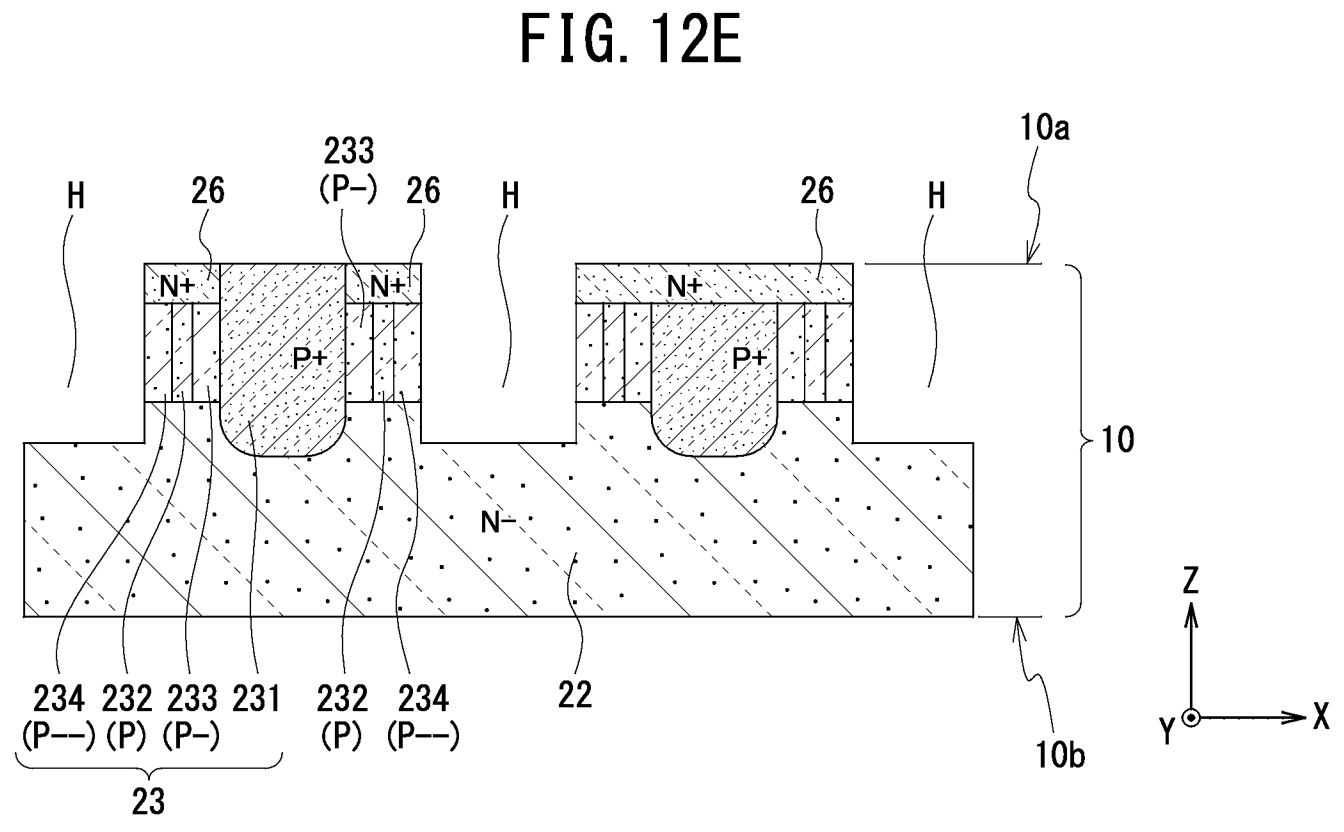
Figure 12F:
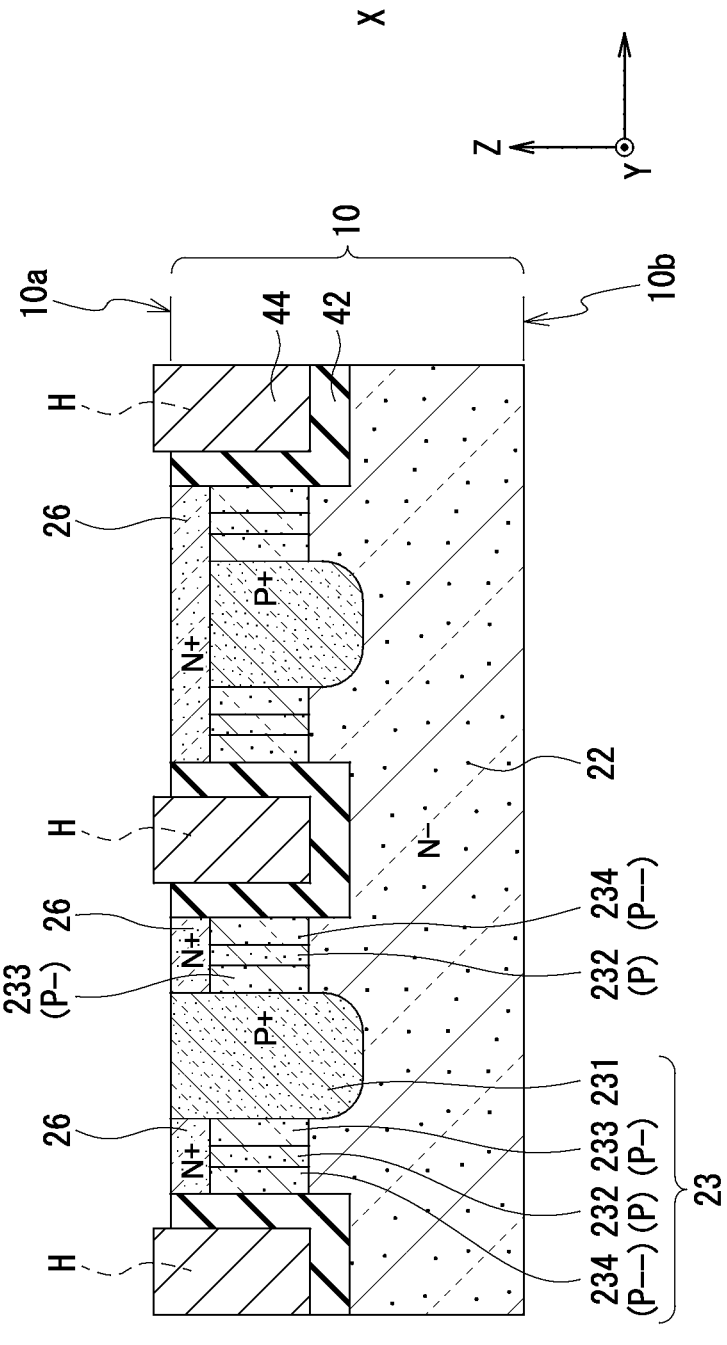
FIG. 12F is still another cross-sectional view illustrative of the method for manufacturing the vertical MOSFET according to the second embodiment of the present disclosure in the sequence of steps.

Next, as illustrated in FIG. 12E, the manufacturing apparatus etches the GaN substrate 10 from the front surface 10*a* side and thereby forms the trenches H. Next, as illustrated in FIG. 12F, the manufacturing apparatus successively forms the gate insulating films 42 and the gate electrodes 44 in the trenches. In addition, the manufacturing apparatus forms the source electrodes 54 (see FIG. 11) and the drain electrode 56 (see FIG. 11). Through the steps as described above, the vertical MOSFETs 1A illustrated in FIGS. 10 and 11 are completed.

Advantageous Effects of Second Embodiment

As described in the foregoing, the GaN semiconductor device 100A according to the second embodiment of the present disclosure includes the GaN substrate 10 and the vertical MOSFETs 1A of the trench gate type that are formed in the GaN substrate 10. In each of the vertical MOSFETs 1A of the trench gate type, the side surfaces of the trench H serve as interfaces IF between the impurity regions 23 and the gate insulating film 42. The vertical MOSFET 1A has a peak position P1 at which Mg concentration reaches a maximum at a position that is located away from each of the interfaces IF in the X-axis direction. In the vertical direction perpendicularly intersecting the interface IF (that is, the X-axis direction), distance d11 from the interface IF to the peak position P1 is 200 nm or more and 1500 nm or less. The Mg concentration at the peak position P1 is $5 \times 10^{18}$ cm$^{-3}$ or more. The Mg concentration at the interface IF of the impurity region 23 is $1 \times 10^{16}$ cm$^{-3}$ or more and $3 \times 10^{18}$ cm$^{-3}$ or less.

In addition, each of the impurity regions 23 has a local peak position P2 at which the Mg concentration reaches a local maximum at a position that is located between the above-described interface IF and the peak position P1 and is located away respectively from the interface IF and from the peak position P1. The local peak position P2 is, for example, a protruding region where a Mg profile inflects, as illustrated in FIG. 6. The Mg concentration at the local peak position P2 is $3 \times 10^{18}$ cm$^{-3}$ or more and a Mg concentration value at the peak position P1 or less.

According to the GaN semiconductor device 100A, a local peak position P2 exists between a side surface of a trench H and a peak position P1 at which the Mg concentration reaches a maximum. The local peak position P2 is formed by Mg being captured in vacancies at the time of heat treatment for activating Mg. The formation of the local peak position P2 causes Mg to be prevented from diffusing to the side surface of the trench H, which enables the Mg concentration at the above-described interface IF and in the vicinity thereof to be suppressed to a low level. As a result, as with the first embodiment, it becomes easier to control the threshold voltage and the mobility of a vertical MOSFET 1A within appropriate ranges and it is thus possible to provide a vertical MOSFET 1A the characteristics of which are prevented from deteriorating.

In addition, in the GaN semiconductor device 100A, it is also possible to maintain the Mg concentration in the P$^+$-type regions 231 at a concentration close to a concentration at the time of the Mg ion implantation (that is, before the heat treatment). As a result, since the width of a depletion layer extending from a P$^+$-type region 231 to the drift region 22 can be enlarged, it is possible to provide a vertical MOSFET 1A the breakdown voltage of which is maintained high.

(Variation)

Figure 13:
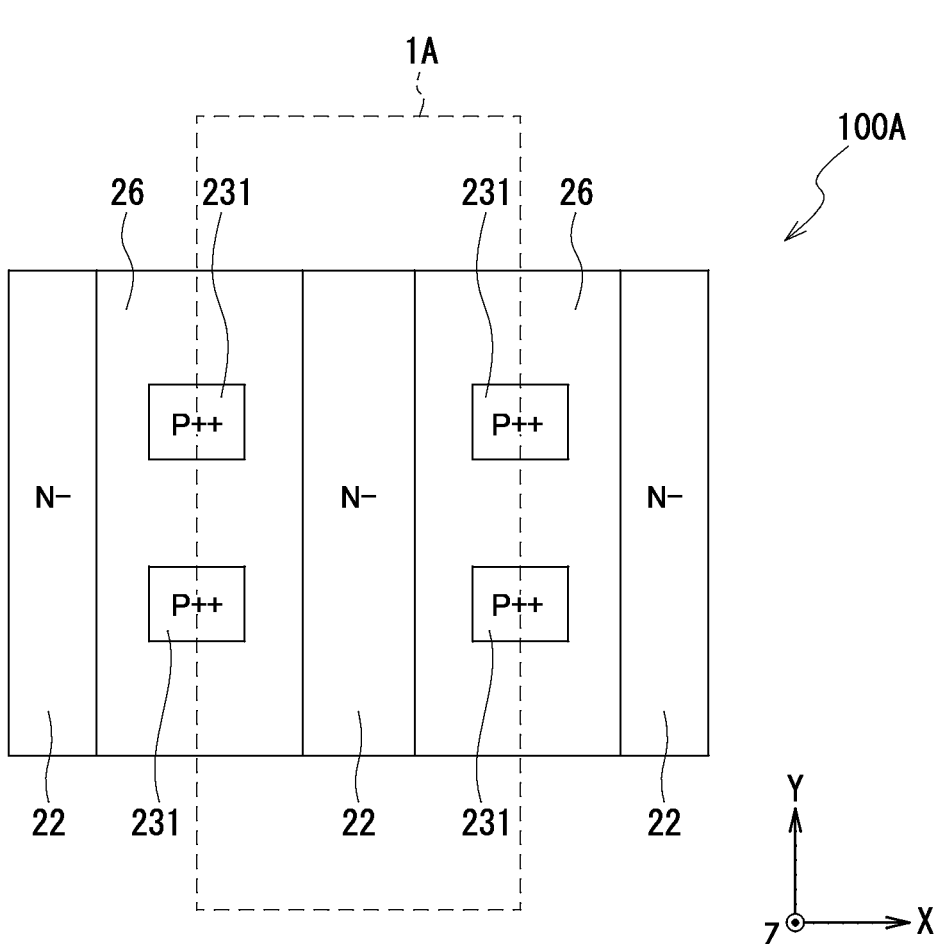
FIG. 13 is a plan view illustrative of a variation of the GaN semiconductor device according to the second embodiment of the present disclosure.

FIG. 13 is a plan view illustrative of a variation of the GaN semiconductor device 100A according to the second embodiment of the present disclosure. As illustrated in FIG. 13, regions that are exposed from the front surface 10a of the GaN substrate 10 (that is, regions that are in contact with the source electrodes 54) within the P$^+$-type regions 231 may be arranged in line in the X-axis direction when viewed in plan. Even in such an aspect, the same advantageous effects as those of the second embodiment illustrated in FIGS. 10 and 11 are achievable.

Other Embodiments

As described above, the present disclosure was described through the embodiments and variations, but the statements and drawings constituting a portion of this disclosure should not be construed as a limitation of the present disclosure. Various alternative embodiments and variations will be made obvious to those skilled in the art by the disclosure. It is needless to say that the present disclosure includes various embodiments and the like that are not described herein. At least one of various kinds of omission, replacement, and modification of the constituent elements can be performed without departing from the gist of the above-described embodiments and variation. Advantageous effects described herein are only exemplifications and are not specifically limited, and other advantageous effects may be achieved. The technical scope of the present disclosure should be determined only by the matters used to specify the invention in the claims regarded as appropriate based on the above descriptions.

Note that the present disclosure may also be configured as follows.

(1)

A nitride semiconductor device including:

a gallium nitride layer having a first principal surface and a second principal surface located on an opposite side to the first principal surface; and a field effect transistor formed in the gallium nitride layer, wherein the field effect transistor includes:

a gate insulating film formed on the first principal surface side of the gallium nitride layer; and an impurity region of P-type formed in the gallium nitride layer and in contact with the gate insulating film, the impurity region has a peak position at which concentration of P-type impurities reaches a maximum at a position located away from an interface between the impurity region and the gate insulating film, in a vertical direction perpendicularly intersecting the interface, distance from the interface to the peak position is 200 nm or more and 1500 nm or less, concentration of the P-type impurity at the peak position is $5 \times 10^{18}$ cm$^{-3}$ or more, concentration of the P-type impurities at the interface of the impurity region is $1 \times 10^{16}$ cm$^{-3}$ or more and $3 \times 10^{18}$ cm$^{-3}$ or less, the impurity region has an inflection point at which concentration of the P-type impurities changes from increase to decrease toward the interface or a rate of decrease in the concentration of the P-type impurities increases toward the interface at a position located between the interface and the peak position and located away respectively from the interface and from the peak position, and concentration of the P-type impurities at the inflection point is $3 \times 10^{18}$ cm$^{-3}$ or more and a concentration value of the P-type impurities at the peak position or less.

(2)

The nitride semiconductor device according to (1), wherein the inflection point is a local peak position at which concentration of the P-type impurities reaches a local maximum.

(3)

The nitride semiconductor device according to (1) or (2), wherein the P-type impurities include at least one of Mg and Be.

(4)

The nitride semiconductor device according to any one of (1) to (3), wherein concentration of the P-type impurities at the peak position is $8 \times 10^{18}$ cm$^{-3}$ or more.

(5)

The nitride semiconductor device according to any one of (1) to (4), wherein the gate insulating film is a $SiO_2$ film.

(6)

The nitride semiconductor device according to any one of (1) to (5), wherein the impurity region includes:

a $P^+$-type region in which concentration of the P-type impurities is high;

a $P^-$-type region in which concentration of the P-type impurities is lower than the $P^+$-type region;

a P-type region in which concentration of the P-type impurities is lower than the $P^+$-type region and higher than the $P^-$-type region; and a $P^{--}$-type region in which concentration of the P-type impurities is lower than the $P^-$-type region, the $P^+$-type region includes the peak position, the P-type region includes the inflection point, and from the interface toward the peak position, the $P^{--}$-type region, the P-type region, the $P^-$-type region, and $P^+$-type region are arranged in this order.

(7)

The nitride semiconductor device according to (6) further including:

a source region of N-type formed in the gallium nitride layer, wherein the source region is in contact with the $P^-$-type region in a direction parallel with the interface.

(8)

The nitride semiconductor device according to (7), wherein the impurity region is interposed between the source region and the second principal surface of the gallium nitride layer.

(9)

The nitride semiconductor device according to any one of (1) to (8), wherein the interface is parallel with the first principal surface of the gallium nitride layer.

(10)

The nitride semiconductor device according to any one of (1) to (9), wherein the field effect transistor is a vertical MOSFET of a planar gate type in which a gate electrode is arranged on the first principal surface via the gate insulating film.

(11)

The nitride semiconductor device according to any one of (1) to (9), wherein the gallium nitride layer has a trench formed from the first principal surface toward the second principal surface side, and the field effect transistor is a vertical MOSFET of a trench gate type in which a gate electrode is arranged in the trench via the gate insulating film.

(12)

A method for manufacturing a nitride semiconductor device including:

a step of ion-implanting P-type impurities into a preset region in a gallium nitride layer from a first principal surface side of the gallium nitride layer;

a step of ion-implanting an inert element into the region from the first principal surface side;

a step of, by subjecting the gallium nitride layer into which the P-type impurities and the inert element are ion-implanted to heat treatment and activating the P-type impurities, forming an impurity region of P-type in the gallium nitride layer; and a step of forming a gate insulating film on the first principal surface side of the gallium nitride layer in which the impurity region is formed, wherein, in the step of ion-implanting the P-type impurities, the method ion-implants the P-type impurities in such a way that in a vertical direction perpendicularly intersecting an interface between the impurity region and the gate insulating film, a position located 200 nm or more and 1500 nm or less away from the interface becomes a peak position of an amount of implanted ions of the P-type impurities, and concentration of the P-type impurities at a peak position of an amount of implanted ions of the P-type impurities is $5 \times 10^{18}$ $cm^{-3}$ or more after the heat treatment.

(13)

The method for manufacturing the nitride semiconductor device according to (12), wherein in the step of ion-implanting the inert element, the method ion-implants the inert element in such a way that a peak position of an amount of implanted ions of the inert element in the vertical direction coincides with a peak position of an amount of implanted ions of the P-type impurities.

(14)

The method for manufacturing the nitride semiconductor device according to (12), wherein in the step of ion-implanting the inert element, the method ion-implants the inert element in such a way that a peak position of an amount of implanted ions of the inert element in the vertical direction is located between the interface and a peak position of an amount of implanted ions of the P-type impurities.

(15)

The method for manufacturing the nitride semiconductor device according to any one of (12) to (14), wherein the inert element includes at least one of N and Ar.

(16)

The method for manufacturing the nitride semiconductor device according to any one of (12) to (15), wherein a maximum temperature of the heat treatment is 800° C. or more and 2000° C. or less.

REFERENCE SIGNS LIST 1, 1A Vertical MOSFET
10 GaN substrate
10a Front surface
10b Back surface
22 Drift region
23' P-type formation region
23 Impurity region
25 Contact region
26' Source formation region
26 Source region
42 Gate insulating film
44 Gate electrode
54 Source electrode
56 Drain electrode
61 Protective film
100, 100A GaN semiconductor device
221 Upper region (JFET region)
222 Lower region
231' $P^+$-type formation region
231 $P^+$-type region
232 P-type region
233 $P^-$-type region
234 $P^{--}$-type region
d1, d11 Distance
H' Trench formation region H Trench
IF Interface
M1, M2, M11 Mask
P'1, P1 Peak position
P2 Local peak position
Rch Channel region

The invention claimed is:

1. A nitride semiconductor device comprising:
a gallium nitride layer having:
    a first principal surface on a first side of the gallium
        nitride layer, and
    a second principal surface on a second side of the
        gallium nitride layer that is opposite to the first side;
        and
a field effect transistor in the gallium nitride layer, the
    field effect transistor including:
    a gate insulating film on the first principal surface; and
    an impurity region of P-type in the gallium nitride layer
        and in contact with the gate insulating film,
    the impurity region has a peak position at which a
        concentration of P-type impurities is at a maximum
        and the peak position is located away from an
        interface between the impurity region and the gate
        insulating film,
    the impurity region has a local peak position at which
        the concentration of P-type impurities is at a local
        maximum and the local peak position is located
        between the interface and the peak position,
    in a vertical direction perpendicularly intersecting the
        interface, a distance from the interface to the peak
        position is 200 nm or more and 1500 nm or less,
    the concentration of P-type impurities at the peak
        position is $5 \times 10^{18}$ cm$^{-3}$ or more,
    the concentration of P-type impurities at the interface
        of the impurity region is $1 \times 10^{16}$ cm$^{-3}$ or more and
        $3 \times 10^{18}$ cm$^{-3}$ or less,
    the concentration of P-type impurities at the local peak
        position is $3 \times 10^{18}$ cm$^{-3}$ or more, and equal to or less
        than the concentration of P-type impurities at the
        peak position.

2. The nitride semiconductor device according to claim 1,
wherein the P-type impurities include at least one of Mg and
Be.

3. The nitride semiconductor device according to claim 1,
wherein concentration of the P-type impurities at the peak
position is $8 \times 10^{18}$ cm$^{-3}$ or more.

4. The nitride semiconductor device according to claim 1,
wherein the gate insulating film is a SiO$_2$ film.

5. The nitride semiconductor device according to claim 1,
wherein
    the impurity region includes:
    a P$^+$-type region in which concentration of the P-type
        impurities is high;
    a P$^-$-type region in which concentration of the P-type
        impurities is lower than the P$^+$-type region;
    a P-type region in which concentration of the P-type
        impurities is lower than the P$^+$-type region and
        higher than the P$^-$-type region; and
    a P$^-$-type region in which concentration of the P-type
        impurities is lower than the P$^-$-type region,
    the P$^+$-type region includes the peak position,
    the P-type region includes the local peak position, and
    from the interface toward the peak position, the P$^-$-type
        region, the P-type region, the P$^-$-type region, and
        P$^+$-type region are arranged in this order.

6. The nitride semiconductor device according to claim 5
further comprising:
    a source region of N-type formed in the gallium nitride
        layer,
    wherein the source region is in contact with the P$^-$-type
        region in a direction parallel with the interface.

7. The nitride semiconductor device according to claim 6,
wherein the impurity region is interposed between the
source region and the second principal surface of the gallium
nitride layer.

8. The nitride semiconductor device according to claim 1,
wherein the interface is parallel with the first principal
surface of the gallium nitride layer.

9. The nitride semiconductor device according to claim 1,
wherein the field effect transistor is a vertical MOSFET of
a planar gate type in which a gate electrode is arranged on
the first principal surface via the gate insulating film.

10. The nitride semiconductor device according to claim
1, wherein
    the gallium nitride layer has a trench formed from the first
        principal surface toward the second principal surface,
        and
    the field effect transistor is a vertical MOSFET of a trench
        gate type in which a gate electrode is arranged in the
        trench via the gate insulating film.

11. A method for manufacturing a nitride semiconductor
device, the method comprising:
    ion-implanting P-type impurities into a preset region in a
        gallium nitride layer from a first principal surface side
        of the gallium nitride layer;
    ion-implanting an inert element into the region from the
        first principal surface side;
    subjecting the gallium nitride layer, into which the P-type
        impurities and the inert element are ion-implanted, to
        heat treatment to activate the P-type impurities so as to
        form an impurity region of P-type in the gallium nitride
        layer; and
    forming a gate insulating film on the first principal surface
        side of the gallium nitride layer in which the impurity
        region is formed,
    wherein, the ion-implanting P-type impurities includes
        ion-implanting the P-type impurities so that
    in a vertical direction perpendicularly intersecting an
        interface between the impurity region and the gate
        insulating film, a position located 200 nm or more and
        1500 nm or less away from the interface becomes a
        peak position of an amount of implanted ions of the
        P-type impurities, and
    a concentration of the P-type impurities at the peak
        position is $5 \times 10^{18}$ cm$^{-3}$ or more after the heat treat-
        ment.

12. The method for manufacturing the nitride semicon-
ductor device according to claim 11, wherein
    the ion-implanting the inert element includes:
    ion-implanting the inert element so that a peak position
        of an amount of implanted ions of the inert element
        in the vertical direction coincides with a peak posi-
        tion of an amount of implanted ions of the P-type
        impurities.

13. The method for manufacturing the nitride semicon-
ductor device according to claim 11, wherein
    the ion-implanting the inert element includes:
    ion-implanting the inert element in so that a peak
        position of an amount of implanted ions of the inert
        element in the vertical direction is located between
        the interface and the peak position of an amount of
        implanted ions of the P-type impurities.

14. The method for manufacturing the nitride semiconductor device according to claim 11, wherein the inert element includes at least one of N and Ar.

15. The method for manufacturing the nitride semiconductor device according to claim 11, wherein a maximum temperature of the heat treatment is 800° C. or more and 2000° C. or less.

\*  \*  \*  \*  \*